(12) United States Patent
Nishitani et al.

(10) Patent No.: US 11,302,507 B2
(45) Date of Patent: Apr. 12, 2022

(54) ELECTRON BEAM GENERATOR AND ELECTRON BEAM APPLICATOR

(71) Applicant: PHOTO ELECTRON SOUL INC., Nagoya (JP)

(72) Inventors: Tomohiro Nishitani, Nagoya (JP); Atsushi Koizumi, Nagoya (JP); Tomoaki Kawamata, Nagoya (JP); Haruka Shikano, Nagoya (JP)

(73) Assignee: Photo electron Soul Inc., Nagoya (JP)

( * ) Notice: Subject to any disclaimer, the term of this patent is extended or adjusted under 35 U.S.C. 154(b) by 249 days.

(21) Appl. No.: 16/500,789

(22) PCT Filed: Mar. 30, 2018

(86) PCT No.: PCT/JP2018/013640
§ 371 (c)(1),
(2) Date: Oct. 3, 2019

(87) PCT Pub. No.: WO2018/186294
PCT Pub. Date: Oct. 11, 2018

(65) Prior Publication Data
US 2021/0035766 A1    Feb. 4, 2021

(30) Foreign Application Priority Data
Apr. 5, 2017 (JP) .............................. JP2017-075602

(51) Int. Cl.
*H01J 1/94* (2006.01)
*H01J 3/02* (2006.01)

(52) U.S. Cl.
CPC ................ *H01J 1/94* (2013.01); *H01J 3/021* (2013.01)

(58) Field of Classification Search
CPC .................................. H01J 1/94; H01J 3/021
See application file for complete search history.

(56) References Cited

U.S. PATENT DOCUMENTS

| 4,969,556 | A  | 11/1990 | Ishimaru |
| 9,934,926 | B2 | 4/2018 | Nishitani |
| 2002/0033449 | A1 | 3/2002 | Nakasuji et al. |
| 2016/0172144 | A1 | 6/2016 | Nishitani |

FOREIGN PATENT DOCUMENTS

| CN | 101726161 A | 6/2010 |
| CN | 104851768 A | 8/2015 |
| CN | 3 024 012 A1 | 5/2016 |
| JP | H 09298032 A | 11/1997 |
| JP | 201522810 A | 2/2015 |

(Continued)

OTHER PUBLICATIONS

European Search Report dated Feb. 24, 2020 for corresponding European application No. 18781434.8 (8 pages).

(Continued)

*Primary Examiner* — Joseph L Williams
(74) *Attorney, Agent, or Firm* — Intellectual Property Law Group LLP

(57) ABSTRACT

The present invention addresses the problem of providing an electron beam generator and an electron beam applicator for which maintenance is facilitated. The electron beam generator comprises a vacuum chamber, a photocathode holder, an activation vessel, and an internal motive power transmission member. The photocathode holder is capable of moving relative to the activation vessel.

20 Claims, 10 Drawing Sheets

(56) References Cited

FOREIGN PATENT DOCUMENTS

JP 5808021 B2 11/2015
TW 201506390 A 2/2015
WO WO02/001597 A1 1/2002

OTHER PUBLICATIONS

Taiwan Office Action dated Oct. 1, 2019 for corresponding Taiwan application No. 107134058 with English translation.
International Search Report, dated Jun. 26, 2018 for corresponding International Application No. PCT/JP2018/013640 with English translation.
Written Opinion of the ISA, dated Jun. 26, 2018 for corresponding International Application No. PCT/JP2018/013640.
MRS-J News, vol. 20, No. 2, May 2008, p. 4-6.
Korean Office Action dated Apr. 20, 2021 for corresponding Korean application No. 10-2019-7030987 with English translation (14 pages).
China Office Action dated Apr. 25, 2021 for corresponding China application No. 201880021419.1 with English translation (11 pages).

ELECTRON BEAM GENERATOR AND ELECTRON BEAM APPLICATOR

CROSS-REFERENCE TO RELATED APPLICATIONS

This application is a U.S. National Phase application, under 35 U.S.C. § 371, of International Application no. PCT/JP2018/013640, with an international filing date of Mar. 30, 2018, and claims priority to Japanese application no. 2017-075602, filed on Apr. 5, 2017, each of which is hereby incorporated by reference for all purposes.

TECHNICAL FIELD

The present invention relates to an electron beam generator and an electron beam applicator, and particularly relates to an electron beam generator and an electron beam applicator in which a photocathode holder can move relative to an activation vessel.

TECHNICAL BACKGROUND

To date, electron-beam sources that utilize GaAs semiconductor photocathodes (GaAs photocathode electron-beam sources) have contributed to the field of accelerator science, as sources for spin-polarized electron beams having high polarization, in elementary particle/hadron physics experiments (precision measurement of Weinberg angle), or as high-brightness electron-beam sources capable of high-repetition short pulses of a high-current beam to generate a 1 kW infrared free-electron laser, and the like.

Further, GaAs photocathode electron-beam sources are strong candidates as high brightness electron-beam sources capable of producing a low-emittance (the area occupied by the beam within phase space) high-current beam for use in next-generation radiation source accelerators, and according to the "International Linear Collider Project," which is a future project for a linear, next-generation accelerator to help unravel the mysteries behind the creation of the universe, are considered as the sole practical high-performance spin-polarized electron sources.

Meanwhile, together with detailed structural analysis and elemental analysis on an atomic scale, intra-structural measurements of electrical and magnetic characteristics are considered crucial for the purposes of miniaturization of semiconductor devices and development of advanced functional materials. Next-generation observation and measurement techniques that exceed existing capabilities will be needed to meet this demand, and development of high-capability electron-beam sources, which is an elemental technique, will be crucial in this regard. GaAs photocathode electron-beam sources are viewed as powerful candidates as electron-beam sources for use in next-generation electron microscopes, due to their high-repetition rate and short pulse width, high brightness, and high spin polarization capabilities.

A GaAs photocathode electron-beam source utilizes a negative electron affinity (hereinafter sometimes denoted as "NEA") surface (a state in which the vacuum level is below the bottom of the conduction band). By utilizing an NEA surface, electrons that have been photoexcited from the valence band to a potential level at the bottom of the conduction band can be output as-is into a vacuum as an electron beam. FIG. 1 shows the concept of generating an electron beam from a GaAs photocathode electron-beam source, and can be explained in terms of the phenomenology of the three-step model: (1) excitation, (2) diffusion, and (3) emission, described next. (See non-patent document 1)

(1) Excitation light impinges on a photocathode, exciting valence band electrons into the conduction band (excitation).

(2) The electrons excited into the conduction band diffuse to the surface (diffusion).

(3) Electrons reaching the surface tunnel through the surface barrier and is emitted into the vacuum (emission).

A GaAs semiconductor has electron affinity (the energy difference between the vacuum level and the conduction band bottom) of about 4 eV, and the following process is necessary to form an NEA surface state.

(1) First, a p-type doped GaAs semiconductor is heated in a vacuum, and surface impurities such as oxides and carbides are removed to clean the surface. In so doing, band bending is produced in a surface region, and the vacuum level is lowered to about half the bandgap ($\phi_B$) of the semiconductor.

(2) Next, as shown in FIG. 2, in order to obtain a very small photocurrent on the crystal surface, first, cesium is vapor deposited thereon, and then cesium deposition and oxygen addition are repeated alternately until maximum photocurrent is obtained, for each saturation of photocurrent. By lowering the remaining vacuum level ($\phi_D$) by this method, an NEA surface state can be formed (see Non-Patent Document 1).

The NEA surface state refers to a state in which, through the aforedescribed process, the energy level of the vacuum level of the photocathode is brought to a state lower than the energy level of the conduction band bottom. However, electrons can be emitted into a vacuum even when the energy level of the vacuum level of the photocathode is higher than the energy level of the conduction band bottom. Moreover, even after treatment to bring the photocathode to the NEA surface state, continued emission of electrons may in some cases lead to electrons being emitted while the energy level of the vacuum level of the photocathode returns to a high level from a level lower than the energy level of the conduction band. Consequently, in cases in which the photocathode is used as an electron-beam source, it is preferable to lower the energy level of the vacuum level of the photocathode to the greatest extent possible; however, it is not essential to bring about or maintain the NEA surface state. Accordingly, in the present invention, "treatment to lower electron affinity" refers to a treatment to lower the energy level of the vacuum level of the photocathode to a level at which electrons can be emitted. Herein, "treatment to lower electron affinity" is sometimes referred to as "EA surface treatment," and a state in which, through "treatment to lower electron affinity," the energy level of the vacuum level of the photocathode has been lowered to a level at which electrons can be emitted, as an "EA surface."

An EA surface is degraded by adsorption of trace amounts of $H_2O$, CO, $CO_2$, or other residual gases, or by backflow of ionized residual gases onto the EA surface. For this reason, in order to stably output an electron beam from a photocathode for an extended period, an ultrahigh degree of vacuum is necessary for treatment and maintenance. Moreover, the quantity of electrons output by an EA surface-treated photocathode is finite, and once a given quantity of electrons has been emitted, it is necessary to again subject the photocathode surface to EA surface treatment.

A prior-art electron gun using an EA surface-treated photocathode includes at least an EA surface treatment chamber, an electron gun chamber, and a means for transporting an EA surface-treated photocathode. As described above, it is necessary for the EA surface-treated photocathode to be loaded into the electron gun without being exposed to the outside air while continuing to maintain an ultrahigh vacuum state after carrying out EA treatment in an ultrahigh vacuum. Additionally, once a given time period has passed, it is necessary to repeat the EA surface treatment of the photocathode, and in the prior art, it was necessary to furnish an EA surface treatment chamber and an electron gun chamber separately. The reason was that in conventional EA surface treatment there is adopted a method involving vapor deposition of a surface treatment material directly onto the photocathode inside a chamber, but when EA surface treatment is carried out in the same chamber, the EA surface treatment material is deposited onto the electron gun chamber and various devices inside the chamber, and EA surface treatment material deposited near the electrodes in particular can lead to the occurrence of field emission dark current, dramatically lowering the capability of the electron gun.

However, in cases in which the EA surface treatment chamber and the electron gun chamber are furnished separately, firstly, two chambers brought to an ultrahigh vacuum state are needed; and further, the transport means is needed to transport the photocathode treated in the EA surface treatment chamber into the electron gun chamber while continuing to maintain the ultrahigh vacuum state, leading to the problem that the electron gun device becomes extremely large. Moreover, because it is necessary for the EA surface-treated photocathode to be moved from the EA surface treatment chamber to the electron gun chamber and installed therein while maintaining an ultrahigh vacuum, and also to be moved from the electron gun chamber to the EA surface treatment chamber and installed therein during EA surface re-treatment of the photocathode, the device must be designed precisely, and proper manipulation of the photocathode is necessary to avoid dropping it during transport, leading to the problem of complicated device management.

To solve the problems described above, in Patent Document 1 (Japanese Patent Publication No. 5808021), an activation vessel for performing a treatment to lower electron affinity of a photocathode material is disposed inside a vacuum chamber. Specifically, in Patent Document 1, the chamber for generating an electron beam and the chamber for performing an EA surface treatment are the same.

PRIOR ARTS LIST

Patent Documents

[Patent Document 1] Japanese Patent Publication No. 5808021

Non-patent Documents

[Non-patent Document] MRS-J NEWS, Vol. 20, No. 2, May 2008

SUMMARY OF THE INVENTION

Problems to be Solved by the Invention

Patent Document 1 indicates that a drive means is provided in order to change the position of a photocathode holder. In Patent Document 1, a motor or another drive means is attached to an activation vessel or attached to an inner side of a vacuum chamber.

The following problems occur when a motor is disposed inside a vacuum chamber. Firstly, in a process of bringing the interior of the vacuum chamber to a high vacuum state, the vacuum chamber must be heated (e.g., to about 200° C.), but there is a possibility that a motor could malfunction or that a magnet could weaken due to the heating, etc. When the motor malfunctions, the vacuum state inside the vacuum chamber is released and the motor must be repaired or replaced. A long period of time (e.g., one week) is needed to bring the vacuum chamber interior to a high vacuum state. Therefore, when a motor malfunction is found after a high vacuum state has been achieved, the work of preparing for the long period of time needed to achieve the high vacuum state is a waste due to the motor being repaired or replaced. Secondly, a magnet or other magnetic-field-generating member is included in the motor. Therefore, the paths of electrons outputted by the photocathode material are curved by the magnetic-field-generating member.

In view of this, a purpose of the present invention is to provide an electron beam generator and an electron beam applicator that are easily maintained. An arbitrary additional purpose of the present invention is to provide an electron beam applicator and an electron beam generator having an activation vessel disposed inside a vacuum chamber, wherein a motor that generates a magnetic field is not provided in the vacuum chamber, whereby it is possible to keep the path of electron beams from deviating away from the desired path.

Means to Solve the Problems

The present invention relates to the electron beam generator and the electron beam application presented below.
(1) An electron beam generator comprising:
 a vacuum chamber;
 a photocathode holder disposed inside the vacuum chamber and supporting a photocathode material;
 an activation vessel disposed inside the vacuum chamber and supporting a surface treatment material that lowers electron affinity of the photocathode material; and
 an internal motive power transmission member that is disposed inside the vacuum chamber and that transmits drive force to the photocathode holder or the activation vessel;
 the photocathode holder being capable of moving relative to the activation vessel.
(2) The electron beam generator according to (1) above,
 further comprising an energy-generating unit that generates mechanical energy for driving the internal motive power transmission member,
 the energy-generating unit being disposed outside of the vacuum chamber.
(3) The electron beam generator according to (2) above,
 wherein the energy-generating unit is a drive source or a manually manipulated member.
(4) The electron beam generator according to any one of (1) to (3) above,
 further comprising an external motive power transmission member disposed outside the vacuum chamber,
 the external motive power transmission member and the internal motive power transmission member being connected so that motive power can be transmitted via a holeless wall in the vacuum chamber.
(5) The electron beam generator according to (4) above,
 wherein the external motive power transmission member transmits drive force to the internal motive power transmission member in a purely mechanical manner.
(6) The electron beam generator according to any one of (1) to (5) above, wherein the internal motive power transmission member is disposed eccentrically with respect to a center axis of the photocathode holder.
(7) The electron beam generator according to any one of (1) to (6) above,
further comprising a guide member disposed inside the vacuum chamber and extending along a first direction,
the guide member guiding movement of the internal motive power transmission member along the first direction.
(8) The electron beam generator according to any one of (1) to (7) above, wherein
the internal motive power transmission member comprises:
a rotating member; and
a conversion mechanism that converts rotation of the rotating member to linear movement of the photocathode holder or the activation vessel.
(9) The electron beam generator according to any one of (1) to (8) above, further comprising:
an anode disposed inside the vacuum chamber; and
a shield that minimizes the incidence of electrical discharge from a protrusion inside the vacuum chamber;
the shield being disposed between the anode and at least part of the internal motive power transmission member.
(10) The electron beam generator according to any one of (1) to (9) above, wherein
the activation vessel comprises:
a first hole through which the photocathode material or electrons emitted from the photocathode material can pass; and
a second hole through which the internal motive power transmission member is inserted.
(11) The electron beam generator according to any one of (1) to (10) above, wherein
the vacuum chamber includes an expanding/contracting part, and
the photocathode holder or the activation vessel moves due to the expanding/contracting part being expanded and contracted.
(12) The electron beam generator according to (11) above, wherein the expanding/contracting part constitutes part of a body of the vacuum chamber or is attached to a head part of the vacuum chamber.
(13) The electron beam generator according to (1) above, further comprising an energy-generating unit that generates heat energy for driving the internal motive power transmission member.
(14) An electron beam applicator comprising the electron beam generator according to any one of (1) to (13) above, wherein the electron beam applicator is
an electron gun,
a free electron laser accelerator,
an electron microscope,
an electron-beam holography microscope,
an electron-beam drawing device,
an electron-beam diffraction device,
an electron-beam inspection device,
an electron-beam metal additive manufacturing device,
an electron-beam lithography device,
an electron-beam processing device,
an electron-beam curing device,
an electron-beam sterilization device,
an electron-beam disinfection device,
a plasma generation device,
an atomic element generation device,
a spin-polarization electron-beam generation device,
a cathode luminescence device, or
an inverse photoemission spectroscopy device.

Advantageous Effects of the Invention

According to the present invention, it is possible to provide an electron beam generator and an electron beam applicator that are easily maintained.

DESCRIPTION OF THE EMBODIMENTS

Below is a detailed description, made with reference to the drawings, of an electron beam generator 1 and an electron beam applicator 100 in the embodiments. In the present specification, members having the same function are designated by the same or similar symbols. In some instances, members designated by the same or similar symbols are described no more than once.

Definitions of Directions

In the present specification, a direction in which a photocathode holder 3 moves toward a first hole 44-1 of an activation vessel 4 is defined as a Z direction. Alternatively, a direction in which electrons emitted from a photocathode (a photocathode material) travel may be defined as the Z direction. The Z direction is, for example, a vertically downward direction, but the Z direction is not limited to a vertically downward direction.

Summary of First Embodiment

Figure 1:
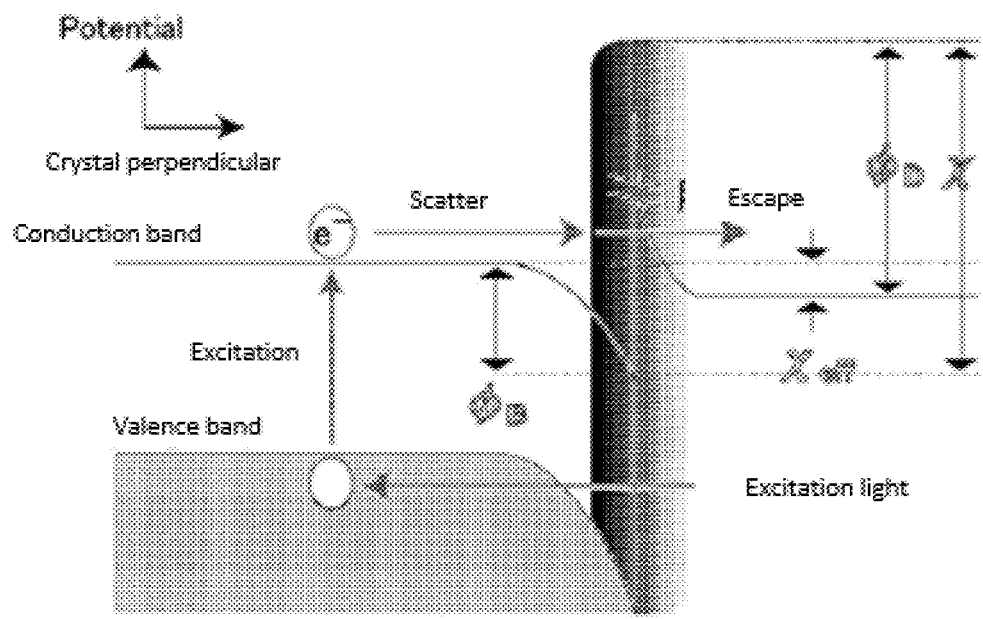
FIG. 1 shows the concept of generating an electron beam from a GaAs photocathode electron-beam source.
Figure 2:
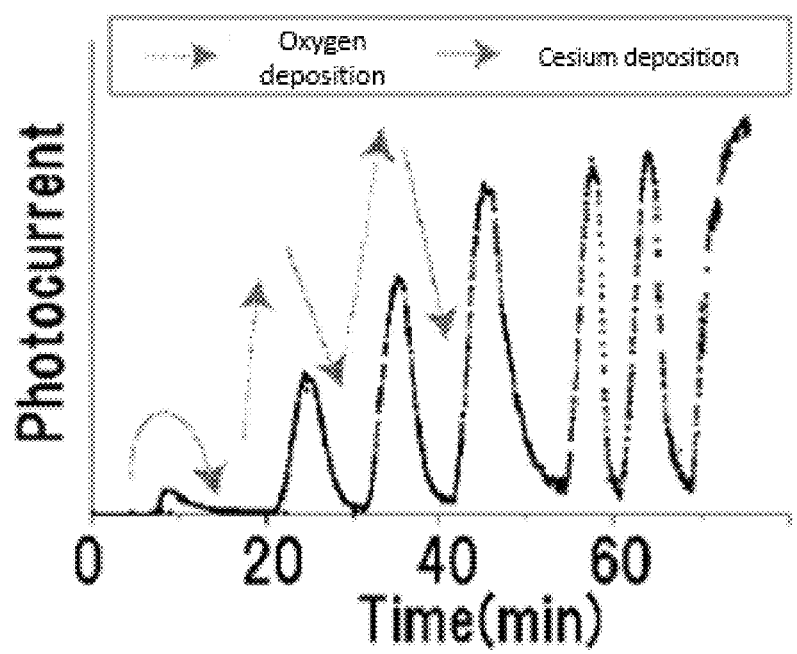
FIG. 2 shows a procedure for forming an EA surface state.
Figure 3:
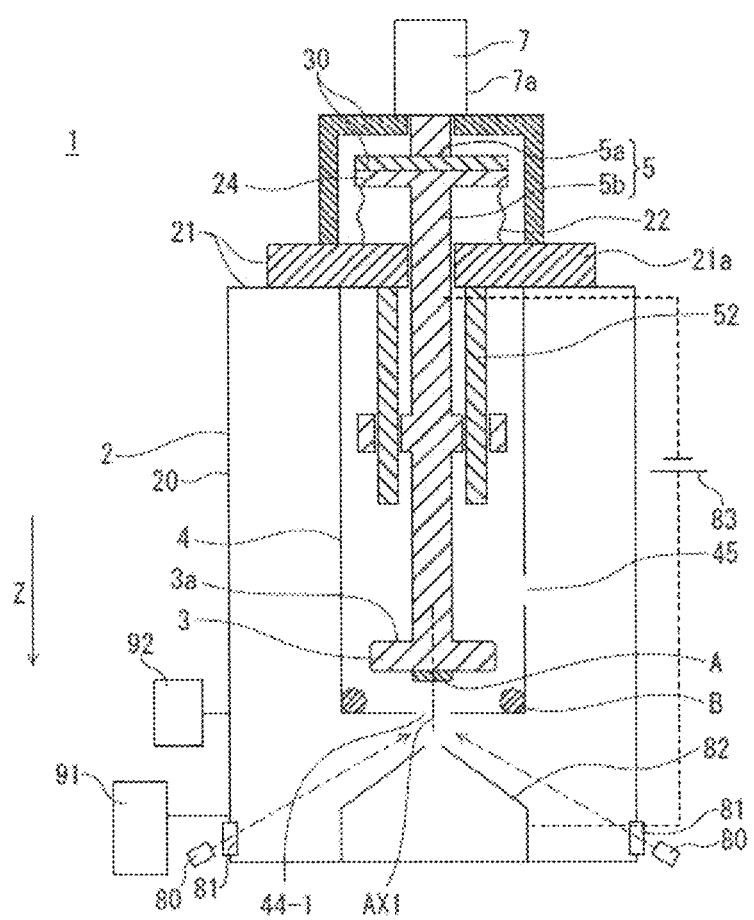
FIG. 3 is a schematic cross-sectional view of an electron beam generator in a first embodiment.
Figure 4:
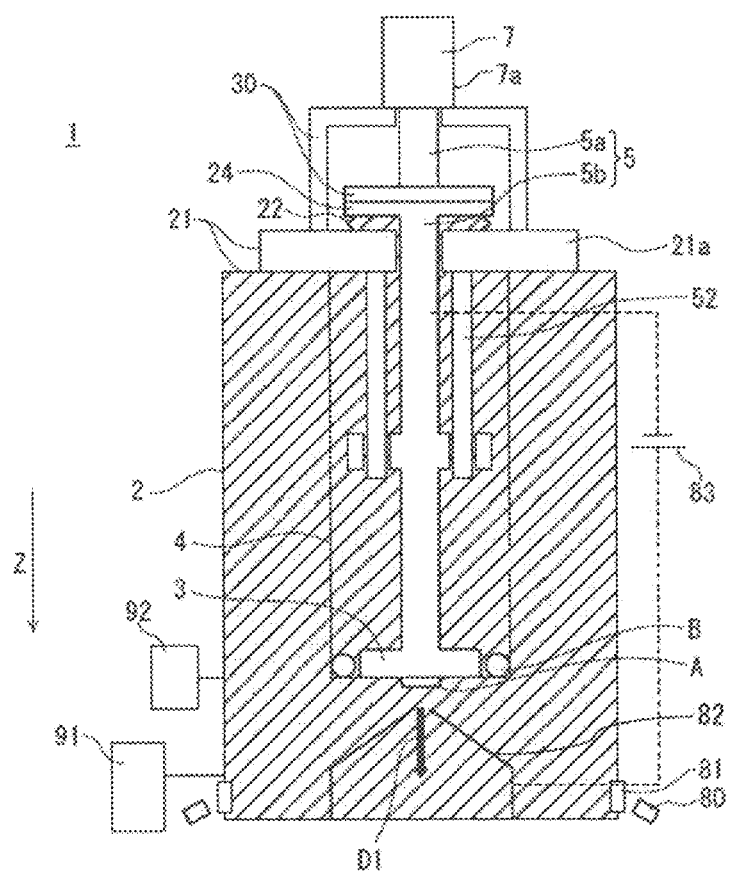
FIG. 4 is a schematic cross-sectional view of the electron beam generator in the first embodiment.
Figure 5:
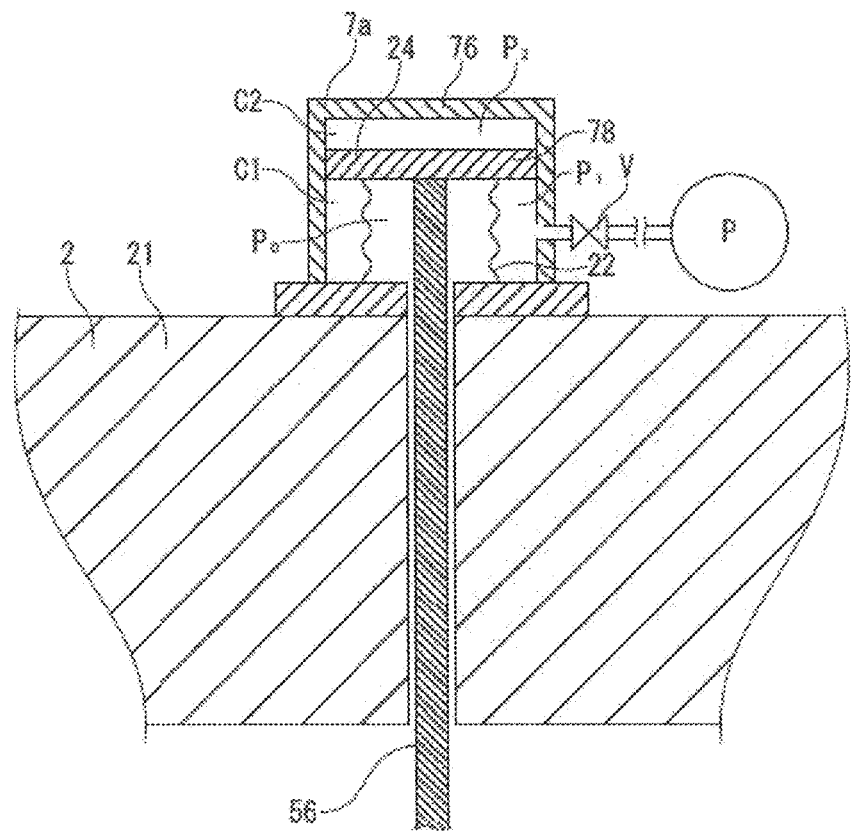
FIG. 5 is a schematic cross-sectional view showing an example of a drive source.
Figure 6:
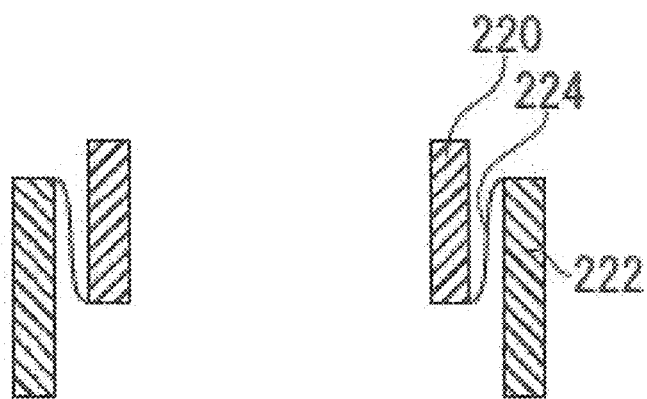
FIG. 6 is a conceptual diagram showing an example of an expanding/contracting part.

The electron beam generator 1 in the first embodiment shall be described with reference to FIGS. 3 through 6. FIGS. 3 and 4 are schematic cross-sectional views of the electron beam generator 1 in the first embodiment. FIG. 5 is a schematic cross-sectional view showing an example of a drive source 7a. FIG. 6 is a conceptual diagram showing an example of an expanding/contracting part. FIG. 3 shows the position of the photocathode holder 3 when an EA surface treatment is carried out, and FIG. 4 shows the position of the photocathode holder 3 when an electron beam generation treatment is carried out. In FIG. 4, the diagonal line portion indicates a vacuum area inside a vacuum chamber 2. Furthermore, in FIG. 4, arrow D1 indicates a direction in which electrons emitted from the photocathode (i.e., the photocathode material A) travel.

The electron beam generator 1 is a device that generates an electron beam in a vacuum atmosphere. A vacuum atmosphere is achieved in the vacuum chamber 2. Additionally, the electron beam generator 1 may be a device that generates an electron beam under high voltage. In this case, the direction in which electrons emitted from the photocathode travel depends on an electric field inside the vacuum chamber during high voltage application.

The electron beam generator 1 comprises the vacuum chamber 2, the photocathode holder 3, the activation vessel 4, and an internal motive power transmission member 5b disposed in the vacuum chamber.

The vacuum chamber 2 is a member for forming a vacuum atmosphere in the electron beam generator 1. When the electron beam generator 1 is in use, the pressure in the interior of the vacuum chamber 2 is set to, for example, $10^{-5}$ Pa or less. A vacuum pump 91 is used to reduce the pressure in the interior of the vacuum chamber 2. The vacuum pump 91 is, for example, prepared separately from the electron beam generator 1 and connected to the electron beam generator 1 via a pipe. A gas supply device 92 that supplies gas used in the EA surface treatment may be connected to the vacuum chamber 2 via a pipe. The gas supplied by the gas supply device 92 is, for example, oxygen, $NF_3$, $N_2$, etc.

There is no particular limitation on the shape of the vacuum chamber 2; the shape of the vacuum chamber 2 may be, for example, cylindrical. In the example shown in FIG. 3, the vacuum chamber 2 is provided with a body part 20, a head part 21, and a bottom part. The material of the vacuum chamber 2 is, for example, stainless steel, titanium, mu-metal, or another metal, or glass, sapphire, ceramic, or another nonmetal.

The photocathode holder 3 is disposed inside the vacuum chamber 2, and the photocathode holder 3 supports a photocathode material A. In the example shown in FIG. 3, the photocathode holder 3 is disposed inside the activation vessel 4 disposed inside the vacuum chamber 2.

The photocathode holder 3 can move relative to the activation vessel 4. When the photocathode holder 3 is in the position shown in FIG. 3, by activating (vaporizing) a surface treatment material B supported in the activation vessel 4, the surface treatment material B can be vapor-deposited on the photocathode material A. When the photocathode holder 3 is in the position shown in FIG. 4, by irradiating light to the photocathode material A supported on the photocathode holder 3, electrons (an electron beam) can be generated from the photocathode material A.

There is no particular limitation on the material of the photocathode holder 3. For example, molybdenum, titanium, tantalum, stainless steel, etc., can be used as the material of the photocathode holder 3.

There are no particular limitations as to the photocathode material A for forming the photocathode provided that an EA surface treatment can be performed on the material. For example, a III-V group semiconductor material or a II-V group semiconductor material can be used as the photocathode material A. Specific examples include AlN, $Ce_2Te$, GaN, $K_2CsSb$, AlAs, GaP, GaAs, GaSb, InAs, etc. Metals are other possible examples of the photocathode material A; specifically, Mg, Cu, Nb, La, $B_6$, $SeB_6$, Ag, etc., can be used.

The photocathode can be fabricated by subjecting the photocathode material A to an EA surface treatment. When a photocathode that uses the photocathode material A is used, it is possible to select the electron-excitation light from within a near-ultraviolet to infrared wavelength region corresponding to the gap energy of the semiconductor. It is also possible to select the electron-beam source capabilities (quantum yield, durability, monochromaticity, temporal response, and spin polarization) corresponding to the electron beam application, by selecting the material and structure of the semiconductor. Therefore, the light source used for electron excitation is not limited to a high-output (watt-class), high-frequency (hundreds of MHz), short pulse (hundreds of femtoseconds) laser. It is possible to generate a beam of unprecedentedly high capabilities even with a relatively inexpensive laser diode.

The photocathode material A is irradiated with light when the electron beam generator 1 is in use. The photocathode material A emits electrons upon receiving light. In the example shown in FIG. 4, emitted electrons move along the Z direction due to voltage applied between the photocathode holder 3 and an anode 82.

The photocathode material A is disposed in a position allowing light to be irradiated thereon. In the example shown in FIG. 4, the photocathode material A is disposed on a bottom surface of the photocathode holder 3.

In the example shown in FIGS. 3 and 4, drive force is imparted to the photocathode holder 3 in order to move the photocathode holder 3 between a position shown in FIG. 3 and a position shown in FIG. 4.

The activation vessel 4 is disposed inside the vacuum chamber 2, and the vessel supports the surface treatment material B which reduces the electron affinity of the photocathode material A. The surface treatment material B is activated (vaporized) within the activation vessel 4. The activated (vaporized) surface treatment material B is vapor-deposited on the photocathode material A.

The activation vessel 4 includes the first hole 44-1. The first hole 44-1 is a hole through which the photocathode material A supported by the photocathode holder 3 can pass, or a hole through which electrons emitted from the photocathode material A can pass. The first hole 44-1 is preferably large enough to allow at least electrons to pass through. The diameter of the first hole 44-1 is, for example, 1 nm to 10 mm (inclusive), and more preferably 50 μm to 5 mm (inclusive), etc., from the standpoint of facilitating machining, or the standpoint of facilitating adjustment of the positional relationship between the first hole 44-1 and the electrons emitted from the photocathode material A. When the photocathode material A is exposed to the exterior of the activation vessel 4 through the first hole 44-1 (see FIG. 4), the size of the first hole 44-1 may be greater than the upper limits of the numerical value ranges given above.

There are no particular limitations as to the material of the activation vessel 4. For example, glass, molybdenum, ceramic, sapphire, titanium, tungsten, tantalum, stainless steel, or another heat-resistant material (e.g., a heat-resistant material that can withstand temperatures of 300° C. and above, more preferably 400° C. and above) can be used.

There are no particular limitations as to the shape of the activation vessel 4. The activation vessel 4 is preferably shaped so that the surface treatment material B can be supported therein. The activation vessel 4 is, for example, cylindrical.

The interior of the activation vessel 4 and the exterior of the activation vessel 4 communicate via the first hole 44-1 or another hole 45. Therefore, the pressure inside the activation vessel 4 is substantially equal to the pressure outside the activation vessel 4. The interior of the activation vessel 4 is also kept in a vacuum state when the electron beam generator 1 is in use because the activation vessel 4 is disposed inside the vacuum chamber 2.

When the electron beam generator 1 is in use, the photocathode material A emits electrons. The quantity of electrons outputted by the photocathode material A is limited, and the photocathode surface must therefore again be subjected to an EA surface treatment. With the electron beam generator 1 of the embodiments, both electron beam generation and EA surface treatment can be performed in a single vacuum chamber 2. Specifically, in the state shown in FIG. 3, if the activation vessel 4 or the surface treatment material B itself is heated and the surface treatment material B is activated (vaporized), the surface treatment material B will be vapor-deposited on the photocathode material A. This is how the EA surface treatment can be performed. In the state shown in FIG. 4, an electron beam can be generated as long as the photocathode material A is irradiated with light.

In the present specification, the surface treatment material B can be used to subject the photocathode material to an EA surface treatment. There are no particular limitations as to the surface treatment material B provided that this material can be used to perform an EA surface treatment. Possible examples of elements that could constitute the surface treatment material B include Li, Na, K, Rb, Cs, Te, Sb, etc. Among the aforementioned elements, Li, Na, K, Rb, and Cs in isolation spontaneously combust and cannot be stored or utilized. It is therefore necessary to use the elements Li, Na, K, Rb, and Cs in the form of composite elements, or compounds that include these elements. On the other hand, when these elements are used in compound form, it is necessary to avoid generation of impurity gases during vapor deposition of the aforementioned elements. Consequently, in cases in which an element selected from Li, Na, K, Rb, and Cs is used as the surface treatment material B, it is preferable to use $Cs_2CrO_4$, $Rb_2CrO_4$, $Na_2CrO_4$, $K_2CrO_4$, or another compound in combination with a reducing agent that suppresses generation of impurity gases. The surface treatment material B is vaporized within the activation vessel 4 using heating means, and vapor-deposited onto the photocathode material A.

In the example illustrated in FIGS. 3 and 4, the activation vessel 4 is secured to an inner wall surface of the vacuum chamber 2 and is incapable of moving relative to the wall surface of the vacuum chamber 2. Drive force is transmitted from the internal motive power transmission member 5b to the photocathode holder 3, and the photocathode holder 3 moves relative to the activation vessel 4. The activation vessel 4 may be secured within the vacuum chamber 2 via a support member, as in a third embodiment described hereinafter. Alternatively, the photocathode holder 3 may be fixed to the wall surface of the vacuum chamber 2 and drive force may be transmitted from the internal motive power transmission member 5b to the activation vessel 4. In this case, the activation vessel 4 moves relative to the photocathode holder 3.

The internal motive power transmission member 5b is disposed inside the vacuum chamber 2 and transmits drive force to the photocathode holder 3 or the activation vessel 4. In the first embodiment, the internal motive power transmission member 5b is a non-magnet member. In the example shown in FIG. 3, there is one internal motive power transmission member 5b disposed inside the vacuum chamber 2, and the one internal motive power transmission member 5b is a non-magnet member. Taking N to be the number of internal motive power transmission members 5b disposed inside the vacuum chamber 2 ("N" being a natural number of 1 or greater), the N internal motive power transmission members 5b are non-magnet members. A non-magnet member is a member not permanently magnetized or a member that despite being permanently magnetized has a low level of permanent magnetization, and because no magnetic field is generated (or the magnetic field is weak), either there is no effect on the electron beam path of electrons emitted from the photocathode material, or the effect on the electron beam path of electrons emitted from the photocathode material is negligible. In the first embodiment, copper, titanium, stainless steel, aluminum, or another metal, etc., that cannot be permanently magnetized is used as the material of the internal motive power transmission member 5b. In the first embodiment, when iron, nickel, or another metal, etc., that can be permanently magnetized is used as the material of at least some of the internal motive power transmission members 5b, these members are disposed in a position where the electron beam path would not be affected.

In the first embodiment, the internal motive power transmission member 5b is preferably a non-magnet member. Therefore, the internal motive power transmission member 5b has no substantial effect on the electron beam path. Thus, the electron beam path is kept from deviating away from the desired path.

(Example of Optional Additional Configuration in First Embodiment)

FIGS. 3 to 6 are referenced to describe an example of an additional configuration that can be employed in the first embodiment.

Configuration Example 1

A configuration example 1 shall be described with reference to FIG. 3. Configuration example 1 pertains to an energy-generating unit 7.

In the example shown in FIG. 3, the energy-generating unit 7 generates mechanical energy that drives the internal motive power transmission member 5b. The mechanical energy generated by the energy-generating unit 7 is transmitted to the internal motive power transmission member 5b via an external motive power transmission member 5a. This is how the internal motive power transmission member 5b is driven (in other words, the internal motive power transmission member 5b moves). Drive force is imparted to the photocathode holder 3 by the internal motive power transmission member 5b moving. As a result, the photocathode holder 3 moves relative to the activation vessel 4. As described above, in the present specification, the term "internal motive power transmission member 5b" means a member for "transmitting" mechanical energy generated by the energy-generating unit 7 to the photocathode holder 3, and this member is different from a motor or another drive means that generates drive force unaided. In the example shown in FIG. 3, the internal motive power transmission member 5b and the photocathode holder 3 are integrally molded into a single member. Alternatively, the internal motive power transmission member 5b and the photocathode holder 3 may be separately fabricated, and linked via any desired joining means.

In the example shown in FIG. 3, the energy-generating unit 7 is a drive source 7a which generates mechanical energy. The drive source 7a is, for example, an actuator. The actuator is, for example, driven by fluid pressure (a pneumatic actuator, a hydraulic actuator, etc.), an electric actuator, or a solenoid actuator.

FIG. 5 shows an example in which the drive source 7a is a fluid-pressure-driven actuator. In the example shown in FIG. 5, the actuator is provided with a cylinder 76 and a piston 78. The piston 78 is disposed inside the cylinder 76 and linked to an end part of a bellows or another expanding/contracting part 22. The piston 78 functions also as a holeless wall 24 linked to the expanding/contracting part 22. The piston 78 moves due to air, oil, or another fluid being supplied from a pump P into a first chamber C1, or air, oil, or another fluid being discharged from the first chamber C1. The piston 78 is linked to the internal motive power transmission member 5b. Therefore, when the piston 78 moves, the internal motive power transmission member 5b also moves.

In the example shown in FIG. 5, the cylinder 76 is provided with the first chamber C1 and a second chamber C2. The piston 78 is driven by a differential pressure between a pressure $P_1$ inside the first chamber C1 and a pressure $P_2$ inside the second chamber C2. $P_0$ is an internal pressure inside the vacuum chamber 2. In the example shown in FIG. 5, at least pressure-receiving surfaces of the cylinder 76 and the piston 78 function as the external motive power transmission member.

A valve V is disposed in a pipe linking the pump P and the first chamber C1, and a rate at which the fluid flows within the pipe is adjusted by the valve V.

When an actuator is used as the drive source 7a, it is easy to position the photocathode holder 3 in a desired position. To position the photocathode holder 3 in the desired position, for example, a flow rate of fluid supplied to a fluid pressure actuator, a current supplied to an electric actuator, a current supplied to a solenoid actuator, etc., is controlled.

In configuration example 1, the energy-generating unit 7 (more specifically, the drive source 7a) is disposed outside the vacuum chamber 2. Therefore, even when the energy-generating unit 7 includes a magnet or another magnetic field generation member, interference imposed on an electron beam path of this magnetic field generation member is kept to a minimum. When the energy-generating unit 7 does not include a magnetic field generation member, the energy-generating unit 7 does not interfere with the electron beam path.

In configuration example 1, even when the interior of the vacuum chamber 2 reaches a high temperature, any increase in the temperature of the energy-generating unit 7 is minimized, because the energy-generating unit 7 (more specifically, the drive source 7a) is disposed outside the vacuum chamber 2. Therefore, the energy-generating unit 7 does not readily malfunction. Furthermore, the energy-generating unit 7 is easily repaired should the energy-generating unit 7 malfunction. For example, should it be confirmed that the energy-generating unit 7 has malfunctioned after the interior of the vacuum chamber 2 has reached a high vacuum state, the energy-generating unit 7 can be repaired while the high vacuum state inside the vacuum chamber 2 is maintained.

In configuration example 1, the energy-generating unit 7 (more specifically, the drive source 7a) is a linear actuator. Alternatively, the energy-generating unit 7 may be a rotary actuator. In this case, there should be provided a mechanism that converts rotational drive force of the rotary actuator to linear motion of the photocathode holder. In configuration example 1, the energy-generating unit 7 may be a manually manipulated member rather than an actuator or another drive source. In this case, mechanical energy is generated through human input.

In configuration example 1, an example was described in which drive force is imparted to the photocathode holder and the photocathode holder moves relative to the activation vessel. Alternatively, drive force may be imparted to the activation vessel and the activation vessel may move relative to the photocathode holder. In this case, "photocathode holder" and "activation vessel" in the above description of configuration example 1 should be changed to "activation vessel" and "photocathode holder," respectively.

Configuration Example 2

Configuration example 2 shall be described with reference to FIG. 3. Configuration example 2 is an example of a configuration pertaining to a motive power transmission mechanism 5.

In configuration example 2, the energy-generating unit 7 imparts drive force to the photocathode holder 3 via the motive power transmission mechanism 5. As a result, the photocathode holder 3 moves relative to the activation vessel 4. In the example shown in FIG. 3, the motive power transmission mechanism 5 includes a shaft disposed between the energy-generating unit 7 and the photocathode holder 3.

The motive power transmission mechanism 5 is not limited to a shaft. The motive power transmission mechanism 5 may include a gear mechanism, a screw mechanism, a link mechanism, a crank mechanism, a universal joint or other joint mechanism, or a combination of these.

In the example shown in FIG. 3, part of the motive power transmission mechanism 5 (e.g., a shaft) is disposed inside the vacuum chamber 2, and part of the motive power transmission mechanism 5 (e.g., a shaft) is disposed outside the vacuum chamber 2. In other words, the motive power transmission mechanism 5 includes the external motive power transmission member 5a disposed outside the vacuum chamber, and the internal motive power transmission member 5b disposed inside the vacuum chamber. The external motive power transmission member 5a and the internal motive power transmission member 5b are connected so that motive power can be transmitted via the holeless wall 24 of the vacuum chamber 2. The internal motive power transmission member 5b may be referred to as a first motive power transmission member, and the external motive power transmission member 5a may be referred to as a second motive power transmission member.

When part of the motive power transmission mechanism 5 is inserted through a through-hole provided in the vacuum chamber, a deterioration in the degree of vacuum inside the vacuum chamber is unavoidable even if a seal member is disposed in the through-hole. To address this problem, in configuration example 2, the external motive power transmission member 5a and the internal motive power transmission member 5b are connected so that motive power can be transmitted via the holeless wall 24 of the vacuum chamber 2. Therefore, the degree of vacuum inside the vacuum chamber does not deteriorate.

The electron beam generator 1 may be provided with a guide member 52 that guides the movement of the internal motive power transmission member 5b, as shown in FIG. 3. In the example shown in FIG. 3, the guide member 52 extends in a first direction (e.g., the Z direction) and guides the movement of the internal motive power transmission member 5b along the first direction. Due to the presence of the guide member 52, tilting of the photocathode holder 3 is minimized when the photocathode holder 3 moves. In the example shown in FIG. 3, the guide member 52 is secured to the vacuum chamber 2 (more specifically, an upper end part of the guide member 52 is secured to the head part 21 of the vacuum chamber 2).

The number of guide members 52 is preferably two or more from the standpoint of minimizing the tilt of the photocathode holder 3. However, the number of guide members 52 may be one.

In the example shown in FIG. 3, a center axis of the internal motive power transmission member 5b aligns with a center axis AX1 of the photocathode holder 3. Therefore, the motive power transmission mechanism 5 can be simplified.

In configuration example 2, an example was described in which the motive power transmission mechanism 5 transmits drive force from the energy-generating unit 7 to the photocathode holder 3. Alternatively, the motive power transmission mechanism 5 may transmit drive force from the energy-generating unit to the activation vessel 4. In this case, "photocathode holder" and "activation vessel" in the above description of configuration example 2 should be changed to "activation vessel" and "photocathode holder," respectively.

In configuration example 2, the movement of the internal motive power transmission member 5b is movement in a direction along the Z direction. In other words, the internal motive power transmission member 5b does not move in a direction perpendicular to the Z direction. Therefore, the motive power transmission mechanism 5 can be simplified. There is greater degree of freedom in the arrangement of other constituent elements in the vacuum chamber 2 because the internal motive power transmission member 5b does not move in a direction perpendicular to the Z direction. Alternatively, in configuration example 2, the internal motive power transmission member 5b may be designed to be capable of moving in a direction perpendicular to the Z direction.

Configuration Example 3

Configuration example 3 shall be described with reference to FIGS. 3 to 6. Configuration example 3 is an example of a configuration pertaining to the expanding/contracting part 22. In configuration example 3, the vacuum chamber 2 includes the expanding/contracting part 22. In configuration example 3, drive force from the energy-generating unit 7 is used to expand and contract the expanding/contracting part 22, thereby causing the photocathode holder 3 to move.

When the vacuum chamber 2 includes the expanding/contracting part 22, the photocathode holder 3 inside the vacuum chamber 2 can be driven by changing the capacity of the vacuum chamber 2. Due to the presence of the expanding/contracting part 22, the degree of vacuum inside the vacuum chamber 2 does not deteriorate.

In the example shown in FIG. 3, the expanding/contracting part 22 includes a bellows (an accordion member). One end part of the expanding/contracting part 22 is connected to the motive power transmission mechanism 5 (more specifically, the holeless wall 24), and the other end part of the expanding/contracting part 22 is connected to the vacuum chamber 2 (more specifically, a flange part 21a of the vacuum chamber 2). In the example shown in FIG. 3, the expanding/contracting part 22 is provided to the head part 21 of the vacuum chamber 2. When both the expanding/contracting part 22 and the energy-generating unit 7 are disposed in the head part 21 of the vacuum chamber 2, the entire structure of the electron beam generator 1 can be simplified.

The arrangement and structure of the expanding/contracting part 22 are not limited to the example shown in FIG. 3. For example, the expanding/contracting part 22 may be configured from an inner tube 220, an outer tube 222, and a film 224 connecting the inner tube 220 and the outer tube 222, as shown in FIG. 6.

In configuration example 3, an example was described in which the motive power transmission mechanism 5 transmits drive force from the energy-generating unit 7 to the photocathode holder 3. Alternatively, the motive power transmission mechanism 5 may be designed to transmit drive force from the energy-generating unit to the activation vessel 4. In this case, "photocathode holder" and "activation vessel" in the above description of configuration example 3 should be changed to "activation vessel" and "photocathode holder," respectively.

Configuration Example 4

Configuration example 4 shall be described with reference to FIGS. 3 and 4. Configuration 4 is an example of a configuration pertaining to an arrangement of light sources 80.

In configuration example 4, the light sources 80 are disposed outside the vacuum chamber 2. Light from the light sources 80 is irradiated onto the photocathode material A via light transmission windows 81 disposed in a wall part of the vacuum chamber 2. In the example shown in FIG. 3, the light transmission windows 81 are disposed farther along in the Z direction than the photocathode holder 3. Alternatively, the light sources 80 may be disposed toward the side in the opposite direction the Z direction from the photocathode holder. Specifically, light may be inputted from a back surface 3a side of the photocathode holder 3 (i.e., the side of a surface opposite the surface where the photocathode material A is disposed). In this case, a hole through which light can pass or a light transmission material (e.g., a transparent material) is preferably disposed in the photocathode holder 3. Furthermore, in the example shown in FIG. 3, the light sources 80 are disposed outside the vacuum chamber 2, but when light from an optical fiber is irradiated toward the photocathode material A, a light exit end of the optical fiber may be disposed inside the vacuum chamber 2 (alternatively, a light exit end of the optical fiber may be disposed outside the vacuum chamber).

Configuration Example 5

Configuration example 5 shall be described with reference to FIGS. 3 and 4. Configuration 5 is an example of a configuration pertaining to the anode 82 and a power source unit 83.

In configuration example 5, the electron beam generator 1 is provided with the anode 82, and the power source unit 83 which applies a voltage between the anode 82 and the photocathode holder 3 (a cathode electrode). The anode 82 is disposed inside the vacuum chamber 2, and the power source unit 83 is disposed outside the vacuum chamber 2. In the example shown in FIG. 3, a positive electrode of the power source unit 83 is electrically connected to the anode 82, and a negative electrode of the power source unit 83 is electrically connected to the photocathode holder 3 via the internal motive power transmission member 5b. Specifically, the internal motive power transmission member 5b functions also as a conductive member.

In the first embodiment, any one of the above-described configuration examples 1 through 5 may be employed. Alternatively, in the first embodiment, any two of the above-described configuration examples 1 through 5 may be employed. For example, in the first embodiment, configuration examples 1 and 2, configuration examples 1 and 3, configuration examples 1 and 4, configuration examples 1 and 5, configuration examples 2 and 3, configuration examples 2 and 4, configuration examples 2 and 5, configuration examples 3 and 4, configuration examples 3 and 5, or configuration examples 4 and 5 may be employed. Alternatively, in the first embodiment, any three or more of the above-described configuration examples 1 through 5 may be employed.

When a high voltage is applied between the anode 82 and the photocathode holder 3, some of the constituent members of the electron beam generator may be formed from electrical insulation members as necessary. An electrical insulation member is preferably fabricated from a ceramic or another publicly known insulating material. In the example shown in FIG. 3, an electrical insulation member 30 is provided between the external motive power transmission member 5a and the holeless wall 24, and the vessel accommodating the motive power transmission mechanism 5 is also formed from an electrical insulation member 30. The positions of the electrical insulation members 30 shown in FIG. 3 are merely examples, and these members may be positioned anywhere provided that they are locations such that other than a circuit formed by the [power source unit 83-anode 82-photocathode holder 3], the creation of a circuit where electricity flows between the anode 82 and the photocathode holder 3 can be prevented. For example, part of the body of the vacuum chamber 2 may be formed from an electrical insulation member. In the example shown in FIG. 3, the power source unit 83 is connected to the anode 82 and the internal motive power transmission member 5b, but may be connected to other members provided that the circuit [power source unit 83-anode 82-photocathode holder 3] is formed. For example, one end of the power source unit 83 may be connected to the flange part 21a and electrically connected to the photocathode holder 3 via the guide member 52 and the internal motive power transmission member 5b. Though not shown in FIG. 3, a circuit for heating the surface treatment material B may be formed in addition to the circuit formed by the [power source unit 83-anode 82-photocathode holder 3]. In this circuit, for example, an inlet terminal would preferably be secured to the flange part 21a, and an inlet terminal part on the inner side of the vacuum area and the heating means (described hereinafter) of the surface treatment material B would preferably be connected by an electric wire. There are also cases in which a heater for heating the photocathode 4 is provided to the photocathode holder 3. Even in cases in which a heater is provided, for example, an inlet terminal is preferably secured to the flange part 21a, and the heater and the end part of the inlet terminal in the inner side of the vacuum area are preferably connected by an electric wire. A resin that releases a large quantity of gas cannot be used in an ultrahigh vacuum. Therefore, the electric wire is preferably not an electric wire covered with a resin; a pipe, beaded insulator, etc., made of a ceramic or another insulation material is preferably used as necessary on a bare wire in which metal is exposed.

In the ambient air, it is possible for: (1) a low friction coefficient to be maintained between metals due to oxide films easily being formed on metal surfaces; and (2) the friction coefficient to be further lowered using a lubricating oil. In an ultrahigh vacuum environment: (3) when an oxide film is removed by friction, it is not possible to create the oxide film anew, and adhesion between metals therefore occurs, leading to a significant increase in the friction coefficient and to fixation; (4) it is not possible to use a lubricating oil that would be a factor in contaminating the interior of the vacuum vessel; and (5) there is no heat transfer through convection (of a gas or the lubricating oil), and heat is therefore not released, leading to an increase in the temperature of sliding parts, i.e., conditions are created in which abrasion, fixation, etc., are readily caused. Therefore, in the case of a member disposed so as to be substantially in contact with another member within the vacuum area so as to be capable of relative movement, one or both of the relatively moving members may be fabricated by performing a surface treatment or from a nonmetal material.

In the first embodiment, examples of the combination of relatively moving members include the internal motive power transmission member 5b with the guide member 52, and the internal motive power transmission member 5b with the flange part 21a.

There are no particular limitations as to the surface treatment provided that adhesion between metals does not occur and the friction coefficient can be reduced; examples include a diamond-like carbon (DLC) coating, a TiN coating, a TiCN coating, a CrN coating, an S-AH coating, etc. There are no particular limitations as to the nonmetal material provided that the material can withstand a high-temperature vacuum environment, and examples include ceramics, C/C composite, etc.

Second Embodiment

Figure 7:
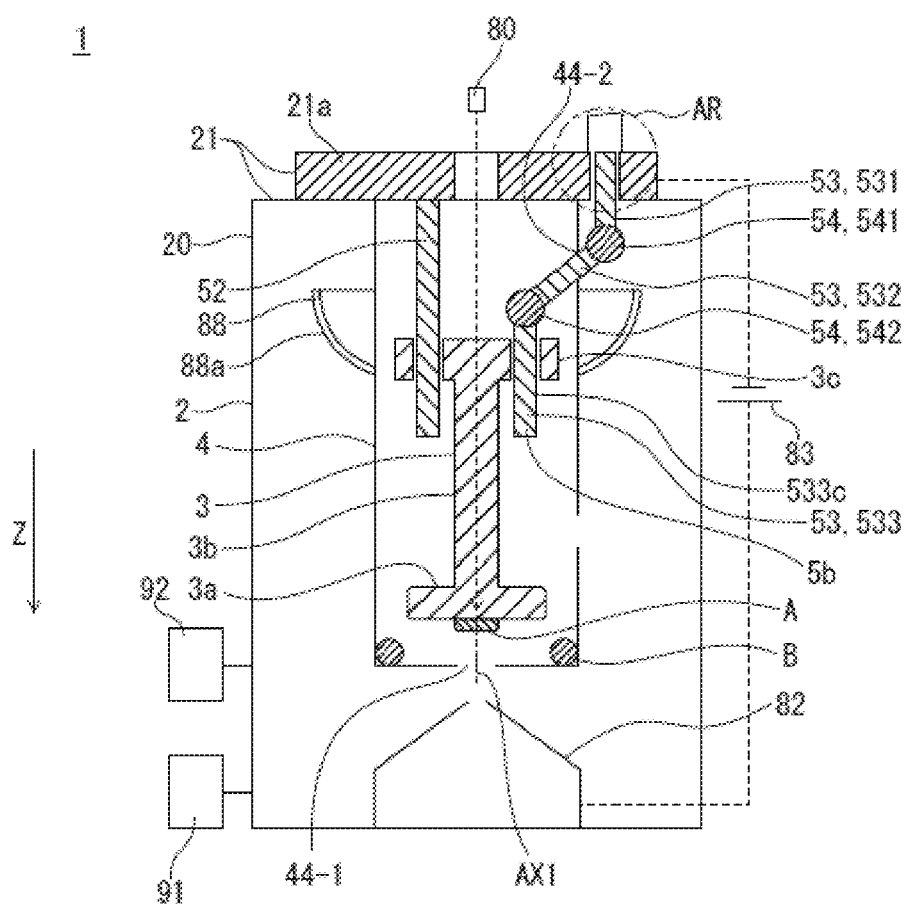
FIG. 7 is a schematic cross-sectional view of an electron beam generator in a second embodiment.
Figure 8A:
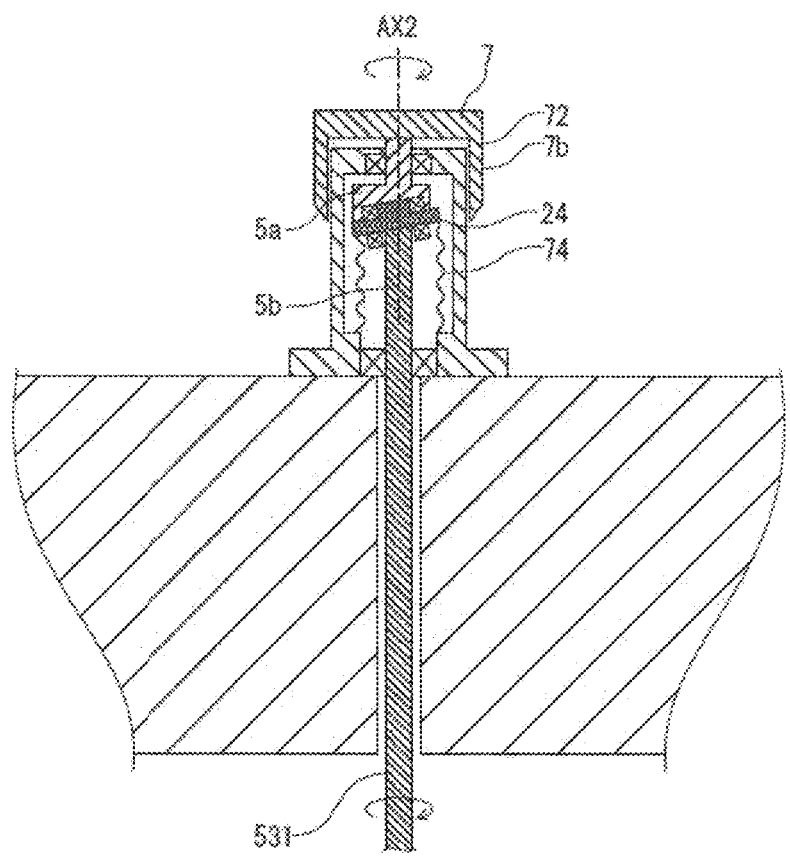
FIG. 8A is an enlarged view of an area AR in FIG. 7.
Figure 8B:
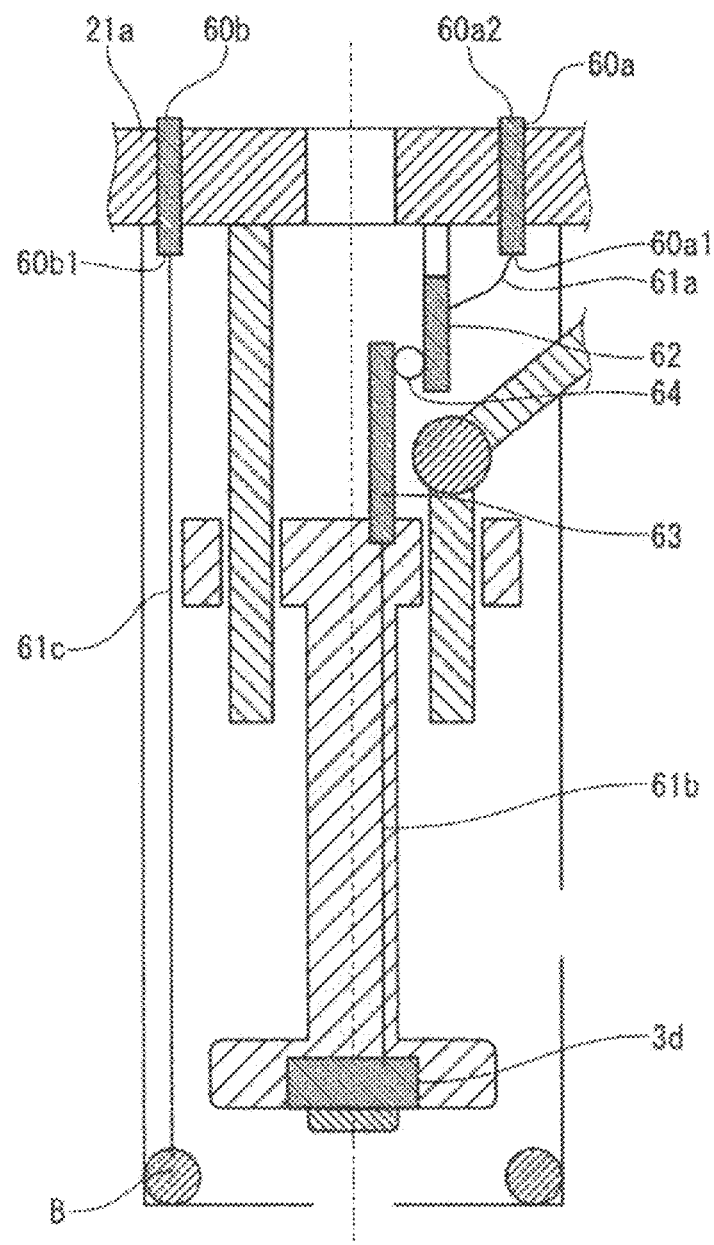
FIG. 8B is an enlarged view of an area AR' in FIG. 7.

A second embodiment shall be described with reference to FIGS. 7 to 9. FIG. 7 is a schematic cross-sectional view of the electron beam generator 1 in the second embodiment. FIG. 8A is an enlarged view of an area AR in FIG. 7. FIG. 8B is an enlarged view of an area AR' in FIG. 7.

In the second embodiment, the specific configurations of the motive power transmission mechanism 5 and the energy-generating unit 7 differ from the specific configurations of the motive power transmission mechanism and the energy-generating unit in the first embodiment. Consequently, in the second embodiment, the description focuses on the motive power transmission mechanism 5 and the energy-generating unit 7, and descriptions that would be repetitive for other configurations are omitted.

In the example shown in FIG. 7, the internal motive power transmission member 5b is disposed eccentrically with respect to the axis AX1 of the photocathode holder 3. In this case, light from the light sources 80 can be introduced to the photocathode material A from the back surface 3a side of the photocathode holder 3. In order for light from the light sources 80 to be introduced to the photocathode material A from the back surface 3a side of the photocathode holder 3, a rod 3b of the photocathode holder 3 either has a light inlet hole or is preferably configured from a light transmission material (a transparent material).

In the example shown in FIG. 7, the light sources 80 are disposed outside the vacuum chamber 2. Therefore, the light sources 80 are not exposed to the harsh environment inside the vacuum chamber 2. When the light sources 80 are disposed outside the vacuum chamber 2, at least part of the vacuum chamber 2 is preferably configured from a light transmission material (e.g., a transparent material). Light from the light sources 80 is preferably introduced into the vacuum chamber 2 via this light transmission material.

In the second embodiment, the arrangement of the light sources 80 is not limited to the example shown in FIG. 7. The light sources 80 may be disposed inside the vacuum chamber 2. Additionally, the positions of the light sources 80 may be the same as the positions of the light sources in the first embodiment.

In the example shown in FIG. 7, the internal motive power transmission member 5b has a rotating member 533 capable of rotating about an axis parallel to the first direction (the Z direction), and a conversion mechanism that converts the rotation of the rotating member 533 to linear movement (e.g., movement along the first direction) of the photocathode holder 3. In the example shown in FIG. 7, the conversion mechanism is a male-threaded part 533c provided to the rotating member 533, and a female-threaded part 3c provided to the photocathode holder 3. The male-threaded part 533c and the female-threaded part 3c are threaded together.

Furthermore, in the example shown in FIG. 7, the internal motive power transmission member 5b includes a universal joint 54. Therefore, there is greater degree of freedom in the arrangement of the motive power transmission mechanism 5. In the example shown in FIG. 7, the internal motive power transmission member 5b includes two universal joints 54. However, the number of universal joints 54 provided to the internal motive power transmission member 5b is not limited to two. There may be one universal joint 54, or there may be three or more. In the example shown in FIG. 7, an example is shown in which a universal joint is used as the internal motive power transmission member 5b, but another member may be used provided that the member is able to transmit motive power within the chamber. For example, a metal wire, etc., may be used as a member that transmits rotation in the same manner as a universal joint.

In the example shown in FIG. 7, an example is shown in which voltage is applied between the flange part 21a and the anode 82. When a high-energy electron beam is required, high voltage is sometimes applied between the anode and the cathode. When there is a protrusion inside the vacuum chamber 2 in such instances, there is a risk of electricity being discharged from the protrusion. The portion of the internal motive power transmission member 5b that protrudes from a second hole 44-2 of the activation vessel 4 could also be a protrusion that discharges electricity. Therefore, the electron beam generator 1 may, as necessary, include a shield 88 that minimizes electrical discharge from the protrusion inside the vacuum chamber 2.

In the example shown in FIG. 7, part of the internal motive power transmission member 5b is covered by the activation vessel 4, and the portion of the internal motive power transmission member 5b that is exposed to the exterior of the activation vessel 4 is shielded from the anode 82 by the shield 88. In other words, the shield 88 is disposed between the anode 82 and at least part of the internal motive power transmission member 5b (specifically, the portion of the internal motive power transmission member 5b that is exposed to the exterior of the activation vessel 4). Therefore, electrical discharge from the internal motive power transmission member 5b is minimized.

The shield 88 may be shaped and arranged as desired as long as electrical discharge from the internal motive power transmission member 5b can be minimized. In the example shown in FIG. 7, an outer surface 88a of the shield 88 is a smooth curved surface. Additionally, there are no corners in the outer surface 88a of the shield 88.

It is preferable to use a material not susceptible to electrical discharge as the material of the shield 88. The material of the shield 88 is, for example, titanium, molybdenum, stainless steel, TiN, etc. The surface of the shield 88 may be coated with titanium, molybdenum, stainless steel, TiN, etc.

In the example shown in FIG. 7, the activation vessel 4 functions as a first shield that covers one part of the internal motive power transmission member 5b, and the shield 88 functions as a second shield that covers another part of the internal motive power transmission member 5b. When the entire internal motive power transmission member 5b is covered by the activation vessel 4 as in the first embodiment, the shield 88 functioning as a second shield may be omitted. The shield 88 may be omitted in the second embodiment as well, because the risk of electrical discharge is small when the applied voltage is low.

An example of the energy-generating unit 7 in the second embodiment shall be described with reference to FIG. 8A. FIG. 8A is an enlarged view of the area AR in FIG. 7.

In the example shown in FIG. 8A, the energy-generating unit 7 is a manually manipulated member 7b. In the example shown in FIG. 8A, when a manipulated knob 72 of the manually manipulated member 7b is rotated, the external motive power transmission member 5a rotates about a rotational axis AX2. When the external motive power transmission member 5a rotates about the rotational axis AX2, the holeless wall 24 revolves about the rotational axis AX2. The holeless wall 24 is fixed to a bellows 74 and is therefore unable to rotate on its own axis. When the holeless wall 24 revolves about the rotational axis AX2, a first shaft 531 of the internal motive power transmission member 5b rotates about the rotational axis AX2. In this manner is drive force (in other words, mechanical energy) from the energy-generating unit 7 transmitted to the internal motive power transmission member 5b via the external motive power transmission member 5a.

In the examples shown in FIGS. 7 and 8A, as in configuration example 2 of the first embodiment, the external motive power transmission member 5a and the internal motive power transmission member 5b are connected such that motive power can be transmitted via the holeless wall 24 of the vacuum chamber 2. Therefore, the degree of vacuum inside the vacuum chamber 2 does not deteriorate.

In the example shown in FIG. 7, the internal motive power transmission member 5b includes a plurality of shafts 53 and a plurality of universal joints 54. More specifically, rotation of the first shaft 531 is transmitted to a second shaft 532 via a first universal joint 541. Rotation of the second shaft 532 is transmitted to a third shaft (the rotating member 533) via a second universal joint 542. The third shaft (the rotating member 533) rotates, whereby the photocathode holder 3 moves linearly.

The second embodiment yields effects similar to the first embodiment.

In any embodiment including the second embodiment, the degree of freedom in the arrangement of the light sources, etc., is improved when the internal motive power transmission member 5b is disposed eccentrically with respect to the center axis of the photocathode holder 3.

Furthermore, in any embodiment including the second embodiment, it is easy to control the positioning of the photocathode holder 3 when the internal motive power transmission member 5b has the rotating member 533 and a conversion mechanism that converts the rotation of the rotating member to linear movement of the photocathode holder 3.

Additionally, in any embodiment including the second embodiment, the degree of freedom in the arrangement of the motive power transmission mechanism including the internal motive power transmission member 5b is improved when the internal motive power transmission member 5b includes a universal joint.

Furthermore, in any embodiment including the second embodiment, electrical discharge from the internal motive power transmission member 5b, etc., is minimized when the electron beam generator 1 includes the shield 88.

Additionally, in any embodiment including the second embodiment, any deterioration in the degree of vacuum inside the vacuum chamber is effectively minimized when the external motive power transmission member 5a and the internal motive power transmission member 5b are connected such that motive power can be transmitted via the holeless wall 24 of the vacuum chamber 2.

In the second embodiment, an example was described in which the motive power transmission mechanism 5 transmits drive force from the energy-generating unit to the photocathode holder 3. Alternatively, the motive power transmission mechanism 5 may be designed to transmit drive force from the energy-generating unit to the activation vessel 4.

In the second embodiment, an example was described in which the energy-generating unit 7 is the manually manipulated member 7b. Alternatively, the manipulated knob 72, etc., may be designed to be driven by a motor, a rotary actuator, etc. In this case, the energy-generating unit 7 in the second embodiment is the drive source 7a.

In the second embodiment as well, as in the first embodiment, concerning a member disposed to be capable of moving relative to another member inside the vacuum chamber, one or both of the relatively moving members may be fabricated from a surface treatment or a nonmetal material. Examples of the combination of the relatively moving members in the second embodiment include the first shaft 531 with the flange part 21a, the male-threaded part 533c with the female-threaded part 3c, and the guide member 52 with the rod 3b.

In the second embodiment as well, as in the first embodiment, there may be provided a circuit for heating the surface treatment material B and a circuit for supplying electricity to a heater for heating the photocathode 4. FIG. 8B is an enlarged view of area AR' in FIG. 7, and shows another example of a circuit for supplying electricity to the heater. As described above, the electric wire that forms the circuit is preferably a bare wire. When two members capable of moving within the vacuum area are connected by a bare wire, the bare wire is also capable of moving within the vacuum area, and there is a risk that the wire will short-circuit or break down due to coming in contact with another member. Therefore, the relatively moving members may be capable of electrical connection through a contact point scheme.

An example of members being connected through a contact point scheme shall be specifically described with reference to FIG. 8B. The example shown in FIG. 8B includes an inlet terminal 60a, a first terminal base 62, a second terminal base 63, a connection part 64 that connects the first terminal base 62 and the second terminal base 63 through a contact point scheme, and bare wires 61a, 61b connecting all these components. The inlet terminal 60a penetrates through and is secured to the flange part 21a so as to be insulated, and can be connected with electric wires at a vacuum area inner end part 60a1 and a vacuum area outer end part 60a2. The first terminal base 62 is secured at one end to the flange part 21a so as to be insulated. The vacuum area inner end part 60a1 of the inlet terminal 60a and the first terminal base 62 are connected by the bare wire 61a. The second terminal base 63 is secured to the photocathode holder 3. The contact part 64 in contact with the second terminal base 63 is provided to the first terminal base 62. The contact part 64 is preferably formed from a plate spring, a coil, or another material having urging force so as to constantly be in contact with the second terminal base 63. The contact part 64 may also be provided to the second terminal base 63 and designed to come into contact with the first terminal base 62. Due to the second terminal base 63 and a heater 3d being connected by the bare wire 61b, electricity can be channeled to the heater 3d from the outer side of the vacuum chamber. A heating means (described hereinafter) of the surface treatment material B is preferably connected using a bare wire 61c and a vacuum area inner end part 60b1 of the inlet terminal 60b penetrating through and secured to the flange part 21a so as to be insulated. In the embodiment shown in FIG. 8B, the relatively moving first terminal base 62 and second terminal base 63 are in contact and energized through the contact part 64, and the bare wires 61a to 61c connect members that do not relatively move. Therefore, in the embodiment shown in FIG. 8B, there is no risk of the bare wires disposed in the vacuum area short-circuiting or breaking down due to coming into contact with other members. The embodiment shown in FIG. 8B may be employed in the first embodiment. Additionally, the embodiment shown in FIG. 8B presents one example of a specific aspect of a contact point scheme, and another format may be used provided that relatively moving members are in contact and energized through a contact point scheme.

Third Embodiment

A third embodiment shall be described with reference to FIG. 9. FIG. 9 is a schematic cross-sectional view of the electron beam generator 1 in the third embodiment.

In the third embodiment, the difference with the electron beam generator in the first embodiment is that an expanding/contracting part 26 constitutes part of the body of the vacuum chamber 2. Additionally, in the third embodiment, the specific configurations of the activation vessel 4, the motive power transmission mechanism 5, and the energy-generating unit 7 differ from the specific configurations of the activation vessel, the motive power transmission mechanism, and the energy-generating unit in the first embodiment. Consequently, in the third embodiment, the description focuses on the expanding/contracting part 26, the activation vessel 4, the motive power transmission mechanism 5, and the energy-generating unit 7, and descriptions that would be repetitive for other configurations are omitted.

Figure 9:
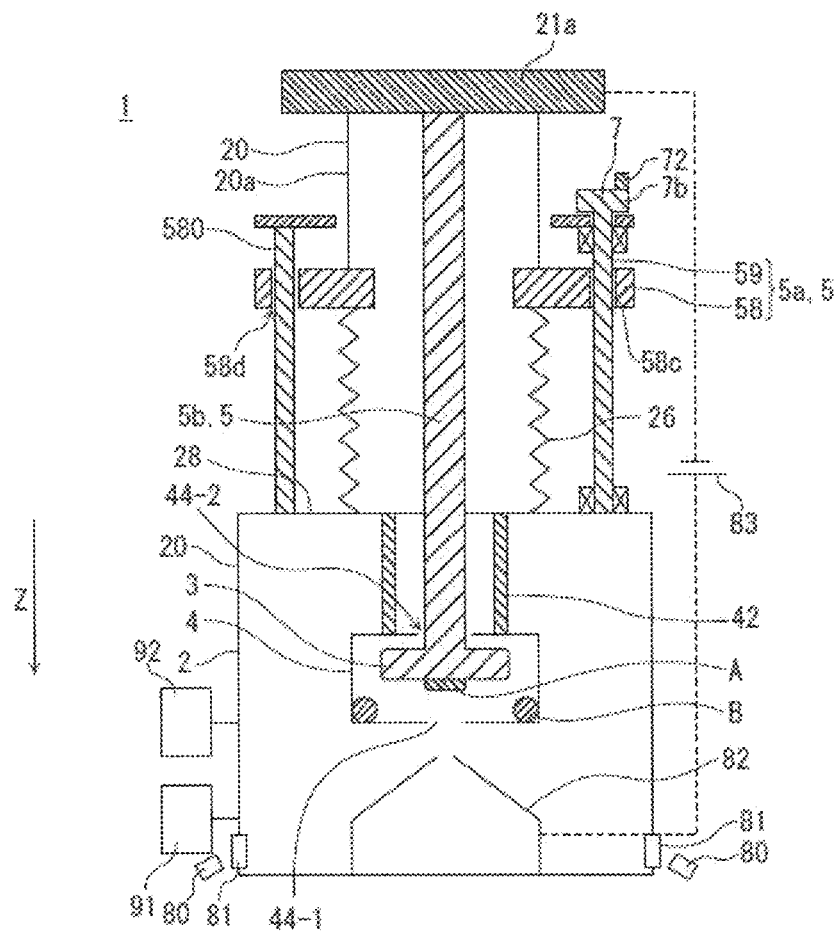
FIG. 9 is a schematic cross-sectional view of an electron beam generator in a third embodiment.

Referring to FIG. 9, in the third embodiment, the expanding/contracting part 26 (e.g., a bellows) constitutes part of the body of the vacuum chamber 2. More specifically, the expanding/contracting part 26 is disposed between a first flange part 58 linked to the vacuum chamber 2 and a second flange part 28 linked to the vacuum chamber 2, and connects the first flange part 58 and the second flange part 28. Therefore, the first flange part 58 is able to move relative to the second flange part 28.

When the first flange part 58 moves relative to the second flange part 28, the internal motive power transmission member 5b, which moves together with the first flange part 58, also moves relative to the second flange part 28. As a result, the photocathode holder 3 linked to the internal motive power transmission member 5b moves relative to the activation vessel 4.

In the example shown in FIG. 9, the internal motive power transmission member 5b is a shaft. Additionally, the internal motive power transmission member 5b and the photocathode holder 3 are one member fabricated by integral molding. Alternatively, the internal motive power transmission member 5b and the photocathode holder 3 may be fabricated separately and linked together via any desired coupling means.

In the example shown in FIG. 9, the internal motive power transmission member 5b is fixed to the head part (more specifically, to the flange part 21a of the head part) of the vacuum chamber 2. Alternatively, the internal motive power transmission member 5b may be fixed to the body part 20 of the vacuum chamber 2.

The external motive power transmission member 5a and the energy-generating unit 7 shall be described next. In the example shown in FIG. 9, the external motive power transmission member 5a includes the first flange part 58 linked to the vacuum chamber 2. Additionally, in the example shown in FIG. 9, the external motive power transmission member 5a includes a threaded rod 59. A threaded hole 58c into which the threaded rod 59 is threaded is provided to the first flange part 58. Therefore, when the threaded rod 59 is rotated about a center axis thereof, the first flange part 58 moves linearly (e.g., moves in the Z direction). Thus, the distance between the first flange part 58 and the second flange part 28 changes, and the expanding/contracting part 26 expands and contracts.

In the example shown in FIG. 9, the threaded rod 59 is connected to the energy-generating unit 7. In the example shown in FIG. 9, the energy-generating unit 7 is the manually manipulated member 7b. When the manipulated knob 72 of the manually manipulated member 7b is manipulated, the threaded rod 59 rotates about the center axis thereof. A body part 20a may be an electrical insulation member.

The electron beam generator 1 may be provided with a guide member 580 (e.g., a guide rod) that guides the movement of the first flange part 58, as shown in FIG. 9. In the example shown in FIG. 9, the guide member 580 is disposed so as to penetrate through a through-hole 58d of the first flange part 58. The number of guide members 580 may be one, two, or more.

In the third embodiment, the vacuum chamber 2 includes the expanding/contracting part 26. Therefore, the internal motive power transmission member 5b (and the photocathode holder 3) inside the vacuum chamber 2 can be moved by changing the capacity of the vacuum chamber 2. The degree of vacuum inside the vacuum chamber 2 does not deteriorate even if the capacity of the vacuum chamber 2 is changed.

The activation vessel 4 shall be described next. In the example shown in FIG. 9, the activation vessel 4 is attached to the vacuum chamber 2 via a support member 42. In the example shown in FIG. 9, the activation vessel 4 is supported by being suspended by a plurality of support members 42.

The activation vessel 4 is provided with the photocathode material A and the first hole 44-1 through which electrons emitted from the photocathode material A can pass. The activation vessel 4 is also provided with a second hole 44-2 through which the internal motive power transmission member 5b is inserted. In the example shown in FIG. 9, the second hole 44-2 is provided to a surface on the side opposite the surface where the first hole 44-1 is provided. More specifically, the first hole 44-1 is provided to a lower surface of the activation vessel 4, and the second hole 44-2 is provided to an upper surface of the activation vessel 4. Alternatively, the second hole 44-2 may be provided to a side surface of the activation vessel 4 (see FIG. 7), as in the activation vessel in the second embodiment.

In the example shown in FIG. 9, the activation vessel 4 is supported in the vacuum chamber 2 via the support members 42. Therefore, the activation vessel 4 can be made smaller than the activation vessel in the first embodiment. The support members 42 preferably support the activation vessel 4 from the side opposite the side where the anode 82 is disposed. In other words, the activation vessel 4 is preferably disposed between the support members 42 and the anode 82. The incidence of electrical discharge from the support members 42 is minimized by disposing the activation vessel 4 between the support members 42 and the anode 82.

The third embodiment yields effects similar to the first embodiment.

Additionally, in any embodiment including the third embodiment, when the expanding/contracting part 26 (e.g., a bellows) constitutes part of the body of the vacuum chamber 2, the internal motive power transmission member 5b can be moved simply by expanding and contracting the expanding/contracting part. The motive power transmission mechanism 5 can be simplified because the movement of the internal motive power transmission member 5b is limited to linear movement.

Furthermore, in any embodiment including the third embodiment, when the activation vessel 4 is attached to the vacuum chamber 2 via the support members 42, the capacity of the activation vessel 4 can be reduced.

Additionally, in any embodiment including the third embodiment, in addition to the first hole 44-1, the activation vessel 4 may also be provided with the second hole 44-2 through which the internal motive power transmission member 5b is inserted. In this case, it is possible for the surface treatment material B to be emitted out of the activation vessel 4 via the second hole 44-2. Therefore, additionally, the surface treatment material B may be hindered from being emitted from the second hole 44-2 by increasing an outside diameter of the photocathode holder 3.

In the third embodiment, an example was described in which the motive power transmission mechanism 5 transmits drive force from the energy-generating unit 7 to the photocathode holder 3. Alternatively, the motive power transmission mechanism 5 may be designed to transmit drive force from the energy-generating unit 7 to the activation vessel 4.

In the third embodiment, an example was described in which the energy-generating unit 7 is the manually manipulated member 7b. Alternatively, the manipulated knob 72, etc., may be designed to be driven by a motor, a rotary actuator, etc. In this case, the energy-generating unit 7 in the third embodiment is the drive source 7a.

(Modification 1 of Motive Power Transmission Mechanism)

The motive power transmission mechanism 5 in the embodiments may convert vibration of the external motive power transmission member to movement of the internal motive power transmission member. In this case, an ultrasonic motor or another vibration source (drive source) is preferably used as the energy-generating unit 7.

(Modification 2 of Motive Power Transmission Mechanism)

In the above-described first through third embodiments and modification 1 of the motive power transmission mechanism, an example was described in which the external motive power transmission member transmits drive force to the internal motive power transmission member in a purely mechanical manner. Alternatively, at least some of the transmission of drive force to the internal motive power transmission member may be performed non-mechanically.

In modification 2 of the motive power transmission mechanism, the transmission of drive force to the internal motive power transmission member is performed thermally. For example, the internal motive power transmission member is envisioned as being configured from a shape memory alloy. In this case, the internal motive power transmission member configured from a shape memory alloy can be expanded and contracted by adding heat to the internal motive power transmission member. As a result, the photocathode holder 3 or activation vessel 4 linked to the internal motive power transmission member moves. Thus, the photocathode holder 3 moves relative to the activation vessel 4.

In modification 2 of the motive power transmission mechanism, the energy-generating unit is configured from a heat source. The energy-generating unit (heat source) generates heat energy that drives the internal motive power transmission member. The heat source may be disposed inside the vacuum chamber and may be disposed outside the vacuum chamber.

(Modification 3 of Motive Power Transmission Mechanism).

In the above-described first through third embodiments and modification 1 of the motive power transmission mechanism, an example was described in which the external motive power transmission member transmits drive force to the internal motive power transmission member in a purely mechanical manner. Additionally, in modification 2 of the motive power transmission mechanism, an example was described in which drive force is transmitted thermodynamically to the internal motive power transmission member. Alternatively, at least some of the transmission of drive force to the internal motive power transmission member may be performed magnetically or electromagnetically.

In modification 3, the external motive power transmission member disposed outside the vacuum chamber 2 includes a magnet, and the internal motive power transmission member disposed inside the vacuum chamber includes a ferromagnetic material attracted to the magnet. In this case, the internal motive power transmission member can be moved by moving the external motive power transmission member.

For the energy-generating unit 7 in modification 3 of the motive power transmission mechanism, a manually manipulated member for moving the external motive power transmission member with man power may be employed, or a drive source for moving the external motive power transmission member without man power may be employed. In modification 3, the magnet is disposed outside the vacuum chamber 2. Therefore, interference with the electron beam path by the magnet is kept to a minimum.

In the above-described embodiments and modifications, various motive power transmission mechanisms were described. However, the motive power transmission mechanism is preferably a purely mechanical motive power transmission mechanism from the standpoint of reducing the effect on the path of the electron beam generated by the electron beam generator 1 as much as possible, and the standpoint of positioning the photocathode holder 3 relative to the activation vessel 4 as accurately as possible. In other words, the external motive power transmission member preferably transmits drive force to the internal motive power transmission member in a purely mechanical manner. In the third embodiment, there are no members disposed so as to substantially come into contact while being capable of relative movement inside the vacuum area. Therefore, the circuit for heating the surface treatment material B and the circuit for energizing the heater for heating the photocathode 4 are preferably formed in the same manner as in the first embodiment.

(Other configurations that can be employed in the embodiments)

Figure 10:
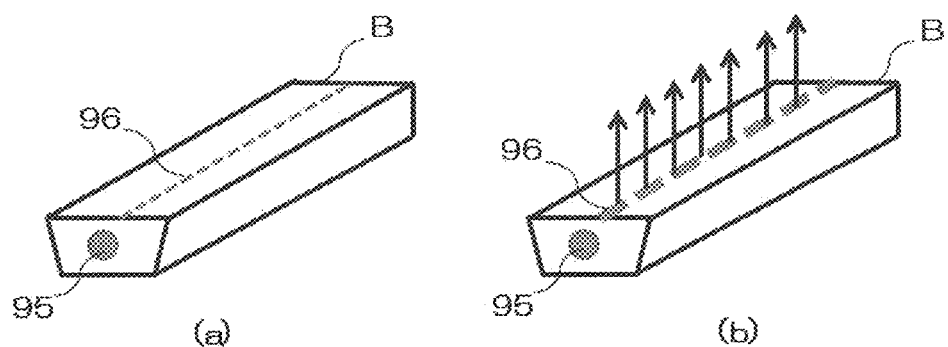
FIGS. 10(a) and 10(b) are drawings schematically depicting an example of a heating means.

Other configurations that can be employed in the embodiments described above shall be described with reference to FIGS. 10 to 12.

(Heating Means)

A heating means for activating the surface treatment material B shall be described with reference to FIGS. 10(a) and 10(b). FIGS. 10(a) and 10(b) schematically depict an example of a heating means.

A heating means 95 heats and vaporizes the surface treatment material B. The heating means 95 may heat the entire activation vessel 4 and thereby indirectly heat the surface treatment material B disposed on the inner side of the vessel, or the heating means may directly heat only the surface treatment material B. Possible examples of the former method include a method of disposing an electric heating coil or another heating means in the activation vessel 4, a method of using an electric heating coil, a lamp heater, etc., to heat the entire vacuum chamber 2 and heat the activation vessel 4, etc.

A possible example of the latter method is a method of using the surface treatment material B combined with a heating means, as shown in FIGS. 10(a) and 10(b). FIG. 10(a) shows an example in which the heating means 95 is incorporated into the surface treatment material B. In the example shown in FIG. 10(a), an electric heating wire or another heating means 95 is inserted through a center part of the surface treatment material B, and incisions 96 along a longitudinal direction are formed in the surface treatment material B. When the heating means 95 is energized, the incisions 96 are enlarged by heating, and vapor of the surface treatment material B is emitted from the enlarged incisions 96, as shown in FIG. 10(b). In this instance, the vapor of the surface treatment material B is emitted with directivity from the incisions 96, and the vapor can therefore be oriented solely in the direction of the photocathode material A.

(Direction Control Means)

Figure 11:
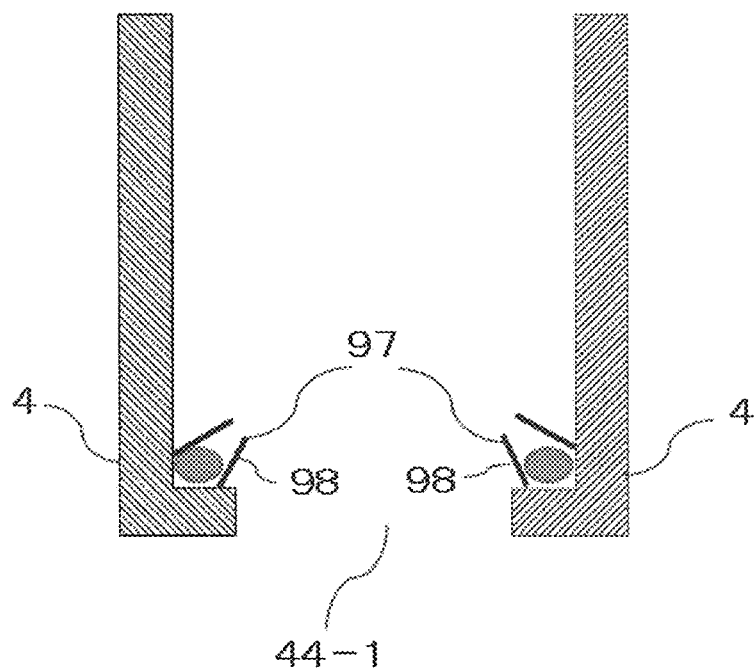
FIG. 11 is a drawing schematically depicting an example of a direction control means.

A direction control means 97 which controls the direction in which vaporized surface treatment material B (vapor of the surface treatment material B) scatters shall be described with reference to FIG. 11. FIG. 11 schematically depicts one example of the direction control means 97.

In the example shown in FIG. 11, two direction control plates 98 are disposed so that the surface treatment material B is interposed therebetween. An angle at which the vaporized surface treatment material B scatters can be adjusted to be greater than 0 degrees and less than 90 degrees relative to a plane containing the end of the first hole 44-1. The number of direction control plates 98 is not limited to two. The number of direction control plates 98 may be one, and may also be three or more.

(Arrangement of Electrodes)

Figure 12:
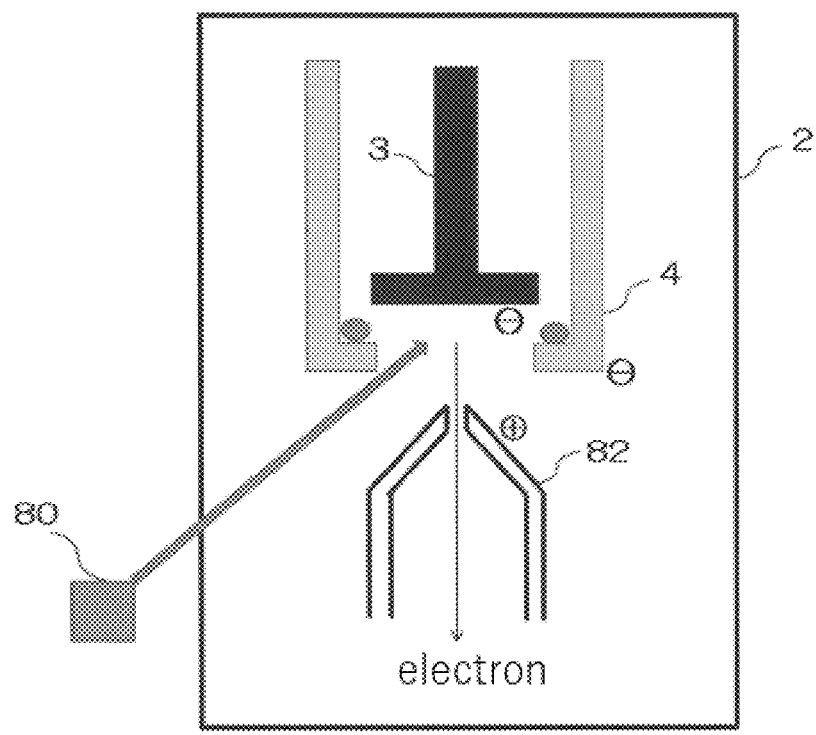
FIG. 12 is a drawing schematically depicting an example of an electrode arrangement.

An example of the arrangement of electrodes shall be described with reference to FIG. 12. FIG. 12 schematically depicts an example of the arrangement of electrodes.

In the embodiments described above, an example of a two-pole structure was described in which the photocathode has a negative charge and the anode 82 has a positive charge.

Alternatively, a three-pole structure can be used by forming the activation vessel 4 from a conductive material and using the activation vessel 4 in a state in which the photocathode holder 3 is not in contact with the vessel, as shown in FIG. 12. In the case of a three-pole structure, a voltage VA of the photocathode and a voltage VB of the activation vessel 4 are preferably not equal to each other and both 0 V or less.

(EA Surface Treatment Method)

An example shall be described of a method for EA surface treatment of the photocathode material A disposed inside the electron beam generator 1 in the embodiments. The EA surface treatment method is carried out by, for example, the following procedure in (1) to (3). During the EA surface treatment, the relative positional relationship between the photocathode holder 3 and the activation vessel 4 is set to, for example, the positional relationship shown in FIG. 3, the positional relationship shown in FIG. 7, or the positional relationship shown in FIG. 9.

(1) The photocathode holder 3 on which the photocathode material A is supported is heated for ten minutes to one hour at 300-700° C. in a vacuum, and cleaned to remove oxides, carbides, and other surface impurities. The heating temperature and time are adjusted, as appropriate, in accordance with the photocathode material being used. In so doing, band bending can be produced in the photocathode material A, and the vacuum level is lowered to about half the bandgap ($\phi_B$) of the semiconductor forming the photocathode.

(2) The surface treatment material B is vapor-deposited so as to obtain a very small photocurrent on the crystal surface of the photocathode material A. This is followed by vapor deposition of the surface treatment material B, and optional addition of a gas such as oxygen, $NF_3$, or $N_2$, repeating these alternately until the maximum photocurrent is obtained, for each saturation of photocurrent. By lowering the remaining vacuum level ($\phi_D$) by this method, an EA surface state can be formed. A gas is added by, for example, spraying the gas supplied from the gas supply device 92 onto the photocathode material A. In the case of vapor deposition of multiple types of surface treatment material B, e.g., Cs and Te, Cs and Sb, etc., onto the photocathode material A, addition of a gas may be unnecessary.

(3) After electron emission for a given time period, EA surface re-treatment is carried out by carrying out the procedure of (2) above.

(Electron Beam Applicator)

Figure 13:
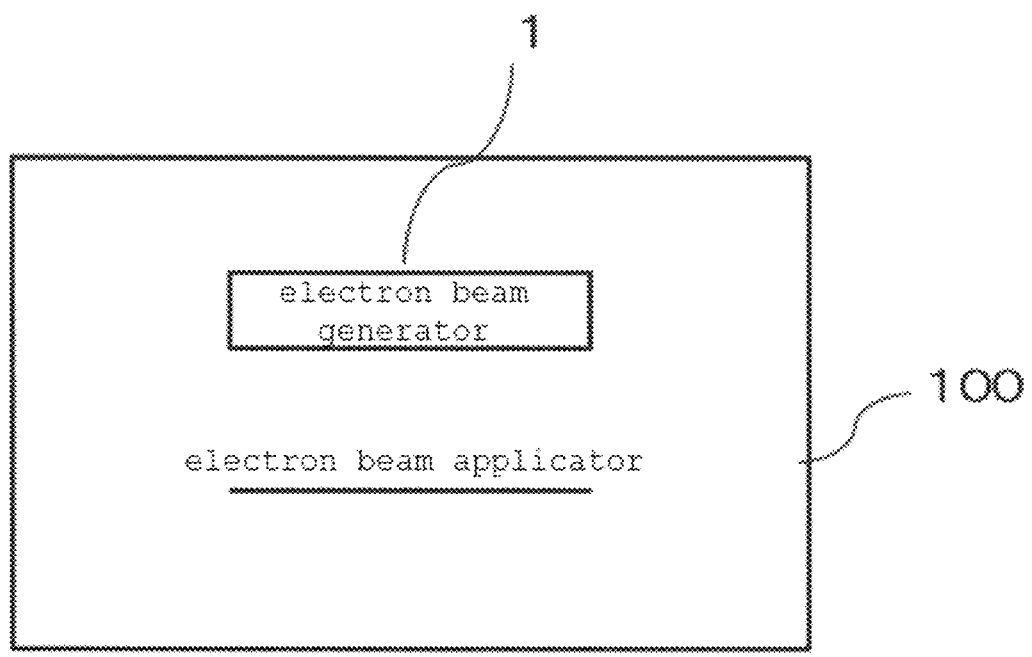
FIG. 13 is a functional block diagram of an electron beam applicator.

An electron beam applicator 100 shall be described with reference to FIG. 13. FIG. 13 is a function block diagram of the electron beam applicator 100.

The electron beam applicator 100 is a device that causes electrons generated by the electron beam generator 1 to be scattered in a desired direction. The electron beam applicator 100 may be a device that irradiates a target with electrons.

The electron beam applicator 100 includes the electron beam generator 1. The electron beam applicator 100 is, for example, an electron gun, a free electron laser accelerator, an electron microscope such as a transmission electron microscope or a scanning electron microscope, an electron-beam holography microscope, an electron-beam drawing device, an electron-beam diffraction device, an electron-beam inspection device, an electron-beam metal additive manufacturing device (3D printer), an electron-beam lithography device, another electron-beam processing device (crosslinking, polymerization, deposition, etching, surface modification, etc.), an electron-beam curing device, an electron-beam sterilization device, an electron-beam disinfection device, a plasma generator, an atomic element (radical) generation device, a spin-polarization electron-beam generation device, an analysis device (a cathode luminescence device, an inverse photoelectron spectroscopy device), etc. In the devices listed above, publicly-known or universally-known configurations may be employed for the configurations other than that of the electron beam generator 1. Therefore, descriptions of these devices are omitted.

The present invention is not limited to the embodiments described above; it is clear that the embodiments can be modified or altered, as appropriate, within the scope of technical ideals of the present invention. Additionally, any constituent elements used in the embodiments, the configuration examples, and the modifications can be combined with other embodiments, and any constituent elements can also be omitted from the embodiments.

INDUSTRIAL APPLICABILITY

When the electron beam generator and the electron beam applicator of the present invention are used, maintenance is facilitated. Therefore, the invention is useful for workers who manufacture electron beam generators and electron beam applicators, and workers who handle electron beams using electron beam generators and electron beam applicators.

REFERENCE SIGNS LIST

1: electron beam generator
2: vacuum chamber
3: photocathode holder
3*a*: rear surface
3*b*: rod
3*c*: female-threaded part
3*d*: heater
4: activation vessel
5: motive power transmission mechanism
5*a*: external motive power transmission member
5*b*: internal motive power transmission member
7: energy-generating unit
7*a*: drive source
7*b*: manually manipulated member
10: electron gun
11: EA surface treatment chamber
12: electron gun chamber
13: transport means
20: body part
20*a*: body part
21: head part
21*a*: flange part
22: expanding/contracting part
24: holeless wall
26: expanding/contracting part
28: second flange part
30: electrical insulation member
42: support member
44-1: first hole
44-2: second hole
45: hole
52: guide member
53: shaft
54: universal joint
58: first flange part
58*c*: threaded hole
58*d*: through-hole
59: threaded rod
60*a*, 60*b*: inlet terminals
60*a*1, 60*b*1: vacuum area inner end parts 60a2: vacuum area outer end part
61a, 61b, 61c: bare wires
62: first terminal base
63: second terminal base
64: contact part
72: manipulated knob
74: bellows
76: cylinder
78: piston
80: light source
81: light transmission window
82: anode
83: power source unit
88: shield
88a: outer surface
91: vacuum pump
92: gas supply device
95: heating means
96: incision
97: direction control means
98: direction control plate
100: electron beam applicator
220: inner tube
222: outer tube
224: film
531: first shaft
532: second shaft
533: rotating member
533c: male-threaded part
541: first universal joint
542: second universal joint
580: guide member
A: photocathode material
B: surface treatment material

The invention claimed is:

1. An electron beam generator comprising:
a vacuum chamber;
a photocathode holder disposed inside the vacuum chamber and supporting a photocathode material;
an activation vessel disposed inside the vacuum chamber and supporting a surface treatment material that lowers electron affinity of the photocathode material; and
an internal motive power transmission member that is disposed inside the vacuum chamber and that transmits drive force to the photocathode holder or the activation vessel;
the photocathode holder being capable of moving relative to the activation vessel,
wherein the internal motive power transmission member is disposed in a vacuum area inside the vacuum chamber and is configured to be driven in the vacuum area only with energy generated from outside the vacuum chamber.

2. The electron beam generator according to claim 1,
further comprising an energy-generating unit that generates mechanical energy for driving the internal motive power transmission member,
the energy-generating unit being disposed outside of the vacuum chamber.

3. The electron beam generator according to claim 2,
wherein the energy-generating unit is a drive source or a manually manipulated member.

4. The electron beam generator according to claim 3,
further comprising an external motive power transmission member disposed outside the vacuum chamber,
the external motive power transmission member and the internal motive power transmission member being connected so that motive power can be transmitted via a holeless wall in the vacuum chamber.

5. The electron beam generator according to claim 2,
further comprising an external motive power transmission member disposed outside the vacuum chamber,
the external motive power transmission member and the internal motive power transmission member being connected so that motive power can be transmitted via a holeless wall in the vacuum chamber.

6. The electron beam generator according to claim 1,
further comprising an external motive power transmission member disposed outside the vacuum chamber,
the external motive power transmission member and the internal motive power transmission member being connected so that motive power can be transmitted via a holeless wall in the vacuum chamber.

7. The electron beam generator according to claim 6,
wherein the external motive power transmission member transmits drive force to the internal motive power transmission member in a purely mechanical manner.

8. The electron beam generator according to claim 6,
wherein the internal motive power transmission member is disposed eccentrically with respect to a center axis of the photocathode holder.

9. The electron beam generator according to claim 6,
further comprising a guide member disposed inside the vacuum chamber and extending along a first direction,
the guide member guiding movement of the internal motive power transmission member along the first direction.

10. The electron beam generator according to claim 6 wherein
the internal motive power transmission member comprises:
a rotating member; and
a conversion mechanism that converts rotation of the rotating member to linear movement of the photocathode holder or the activation vessel.

11. The electron beam generator according to claim 6, further comprising:
an anode disposed inside the vacuum chamber; and
a shield that minimizes the incidence of electrical discharge from a protrusion inside the vacuum chamber;
the shield being disposed between the anode and at least part of the internal motive power transmission member.

12. The electron beam generator according to claim 1,
wherein the internal motive power transmission member is disposed eccentrically with respect to a center axis of the photocathode holder.

13. The electron beam generator according to claim 1,
further comprising a guide member disposed inside the vacuum chamber and extending along a first direction,
the guide member guiding movement of the internal motive power transmission member along the first direction.

14. The electron beam generator according to claim 1 wherein
the internal motive power transmission member comprises:
a rotating member; and
a conversion mechanism that converts rotation of the rotating member to linear movement of the photocathode holder or the activation vessel.

15. The electron beam generator according to claim 1, further comprising:
an anode disposed inside the vacuum chamber; and
a shield that minimizes the incidence of electrical discharge from a protrusion inside the vacuum chamber; the shield being disposed between the anode and at least part of the internal motive power transmission member.

16. The electron beam generator according to claim 1, wherein
the activation vessel comprises:
a first hole through which the photocathode material or electrons emitted from the photocathode material can pass; and
a second hole through which the internal motive power transmission member is inserted.

17. The electron beam generator according to claim 1, wherein
the vacuum chamber includes an expanding/contracting part, and
the photocathode holder or the activation vessel moves due to the expanding/contracting part being expanded and contracted.

18. The electron beam generator according to claim 17, wherein the expanding/contracting part constitutes part of a body of the vacuum chamber or is attached to a head part of the vacuum chamber.

19. The electron beam generator according to claim 1, further comprising an energy-generating unit that generates heat energy for driving the internal motive power transmission member.

20. An electron beam applicator comprising the electron beam generator according to claim 1,
wherein the electron beam applicator is
an electron gun,
a free electron laser accelerator,
an electron microscope,
an electron-beam holography microscope,
an electron-beam drawing device,
an electron-beam diffraction device,
an electron-beam inspection device,
an electron-beam metal additive manufacturing device,
an electron-beam lithography device,
an electron-beam processing device,
an electron-beam curing device,
an electron-beam sterilization device,
an electron-beam disinfection device,
a plasma generation device,
an atomic element generation device,
a spin-polarization electron-beam generation device,
a cathode luminescence device, or
an inverse photoemission spectroscopy device.

* * * * *